United States Patent
Ozawa et al.

(10) Patent No.: US 7,724,543 B2
(45) Date of Patent: May 25, 2010

(54) COMMUNICATION APPARATUS, INFORMATION PROCESSING DEVICE, AND EXTERNAL CABLE CONNECTION METHOD

(75) Inventors: Fujio Ozawa, Kawasaki (JP); Tetsuya Murayama, Kawasaki (JP); Junichi Hayama, Kawasaki (JP); Hiroyuki Abe, Kawasaki (JP); Hisato Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 65 days.

(21) Appl. No.: 11/984,630

(22) Filed: Nov. 20, 2007

(65) Prior Publication Data

US 2008/0068788 A1    Mar. 20, 2008

Related U.S. Application Data

(63) Continuation of application No. PCT/JP2005/009965, filed on May 31, 2005.

(51) Int. Cl.
*H05K 5/00* (2006.01)

(52) U.S. Cl. ............... 361/826; 361/796; 361/729

(58) Field of Classification Search ........... 361/756, 361/826, 752, 730
See application file for complete search history.

(56) References Cited

U.S. PATENT DOCUMENTS

| | | | |
|---|---|---|---|
| 4,797,124 | A | 1/1989 | Beaulieu et al. |
| 6,788,544 | B1 * | 9/2004 | Barsun et al. ............... 361/727 |
| 6,826,055 | B2 * | 11/2004 | Mease et al. ................ 361/725 |
| 6,922,336 | B2 * | 7/2005 | Barsun et al. ............... 361/727 |
| 7,086,539 | B2 * | 8/2006 | Knudsen et al. ............... 211/26 |
| 7,090,084 | B2 * | 8/2006 | Knudsen et al. ............... 211/26 |
| 7,102,884 | B2 * | 9/2006 | Mertesdorf et al. ...... 361/679.4 |

FOREIGN PATENT DOCUMENTS

| | | |
|---|---|---|
| EP | 0 243 086 A2 | 4/1987 |
| JP | 49-46895 | 12/1974 |
| JP | 51-28630 | 7/1976 |
| JP | 56-155476 | 11/1981 |
| JP | 62-296497 | 12/1987 |
| JP | 63-164288 | 10/1988 |
| JP | 01-238097 | 9/1989 |
| JP | 7-1673 | 1/1995 |
| JP | 2002-223292 | 8/2002 |
| WO | WO 2006/129350 | 12/2006 |

* cited by examiner

*Primary Examiner*—Dameon E Levi
(74) *Attorney, Agent, or Firm*—Staas & Halsey LLP

(57) ABSTRACT

A communication apparatus which occupies small space and yet can be connected with numerous external cables and which permits a cooling arrangement to be constructed at low cost. An information processing device constituting the communication apparatus has external cable connection ports provided on both top and bottom surfaces thereof, and thus, more external cables can be connected than in the case of connecting the cables to the side surfaces. Also, the external cables connected to the ports are guided along the top and bottom surfaces toward the front of the communication apparatus with their heights restricted by external cable covers and, therefore, do not occupy substantial space above and below the device. Further, since the external cables are connected to the top and bottom surfaces, the front and rear surfaces of the device have spare space, making it possible to construct a ventilation arrangement such as vent holes and fans.

17 Claims, 22 Drawing Sheets

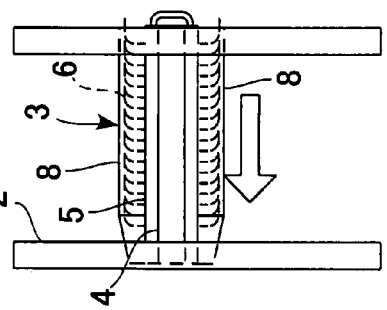
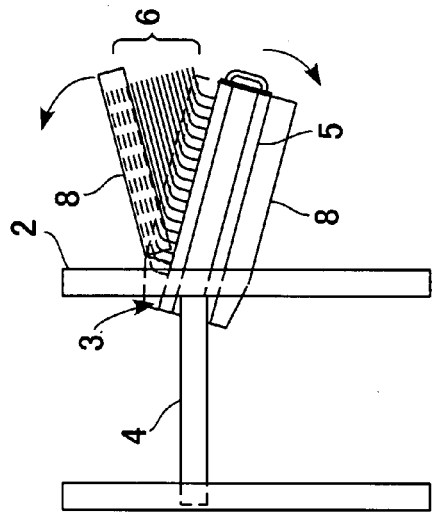
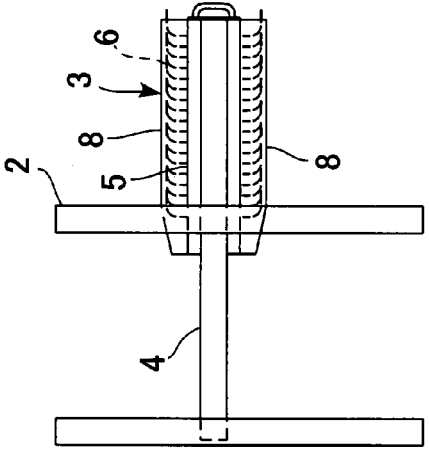
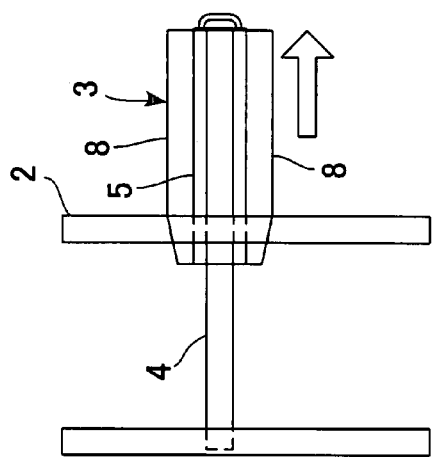
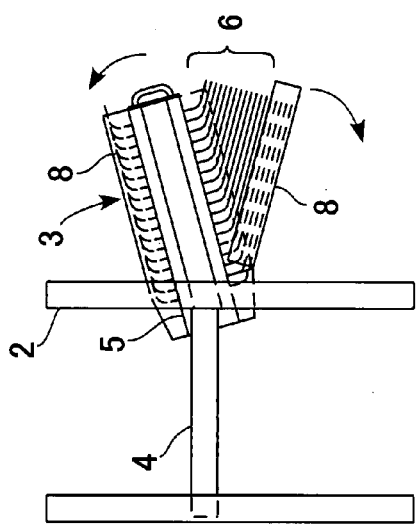
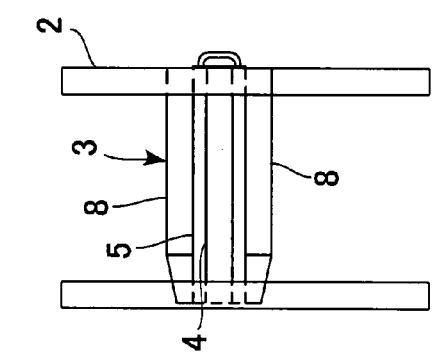

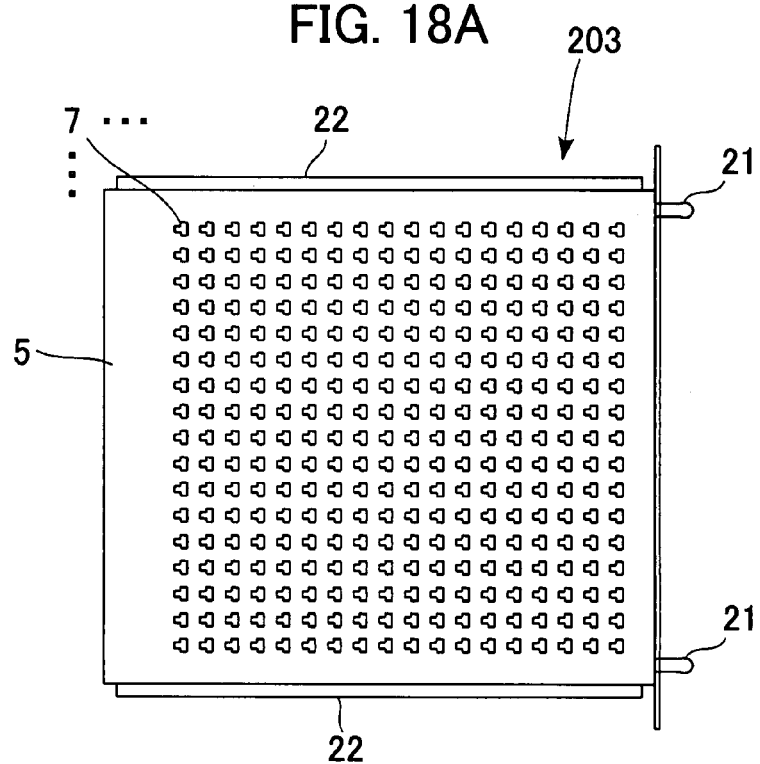
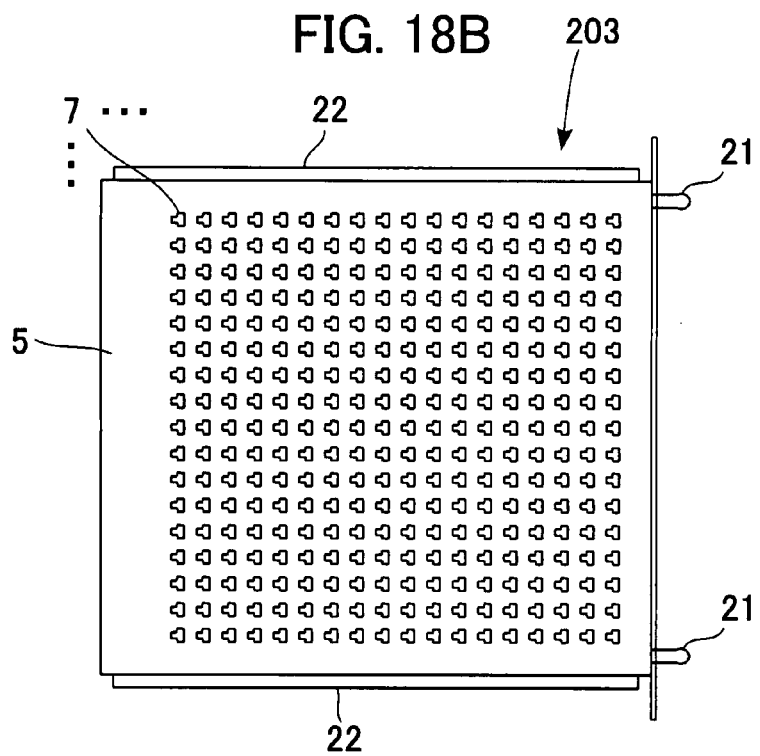

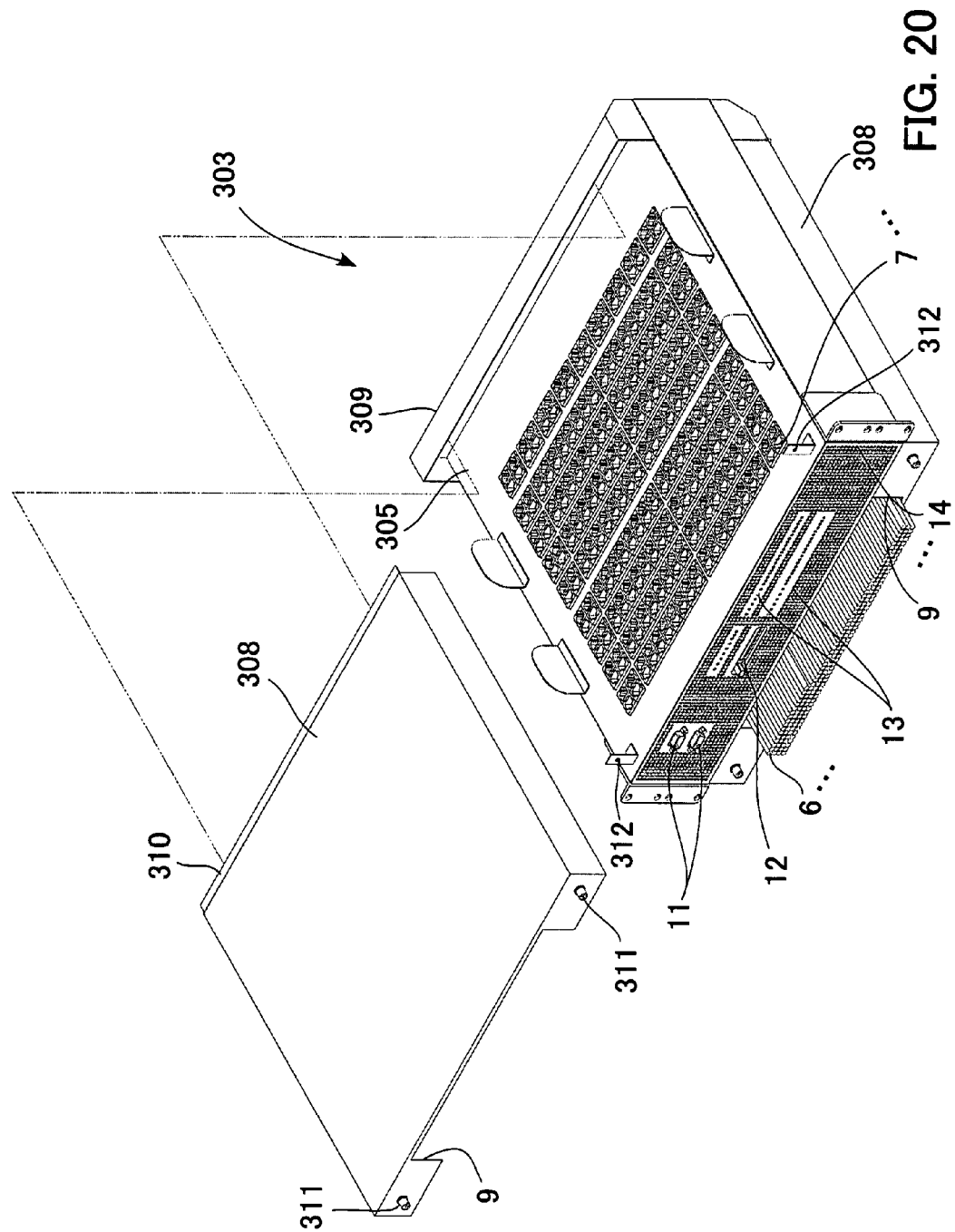

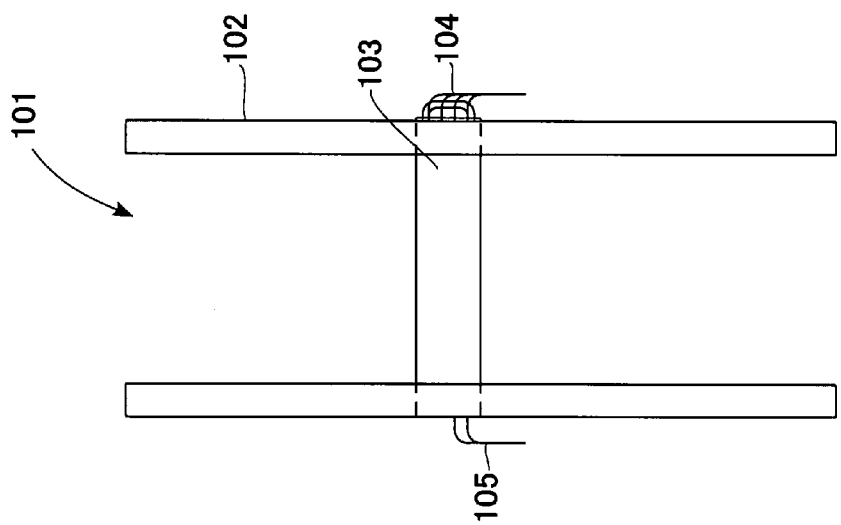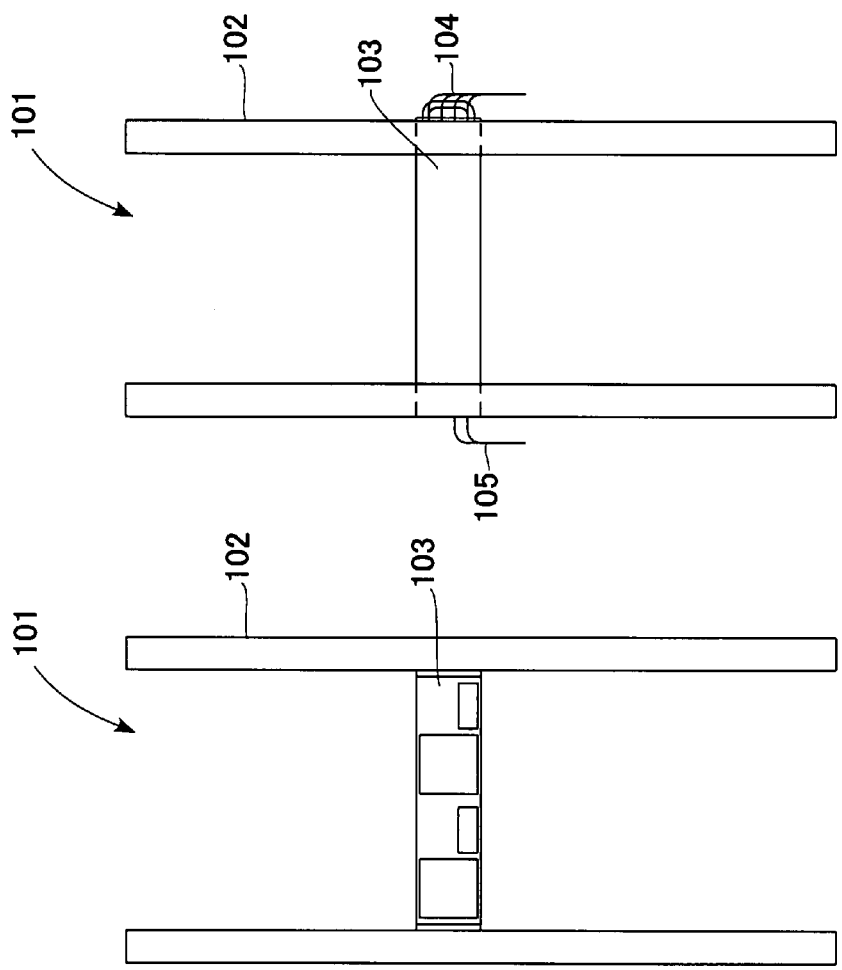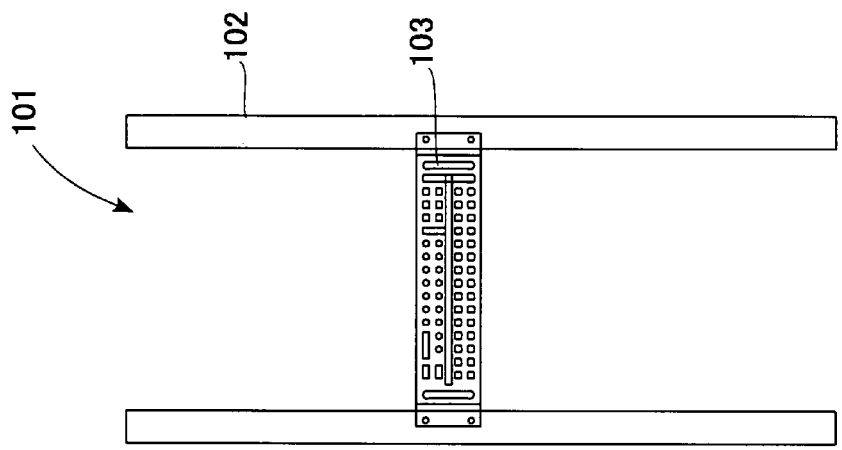

COMMUNICATION APPARATUS, INFORMATION PROCESSING DEVICE, AND EXTERNAL CABLE CONNECTION METHOD

This application is a continuing application, filed under 35 U.S.C. §111(a), of International Application PCT/JP2005/009965, filed May 31, 2005.

BACKGROUND OF THE INVENTION

1. Field of the Invention

The present invention relates to an information processing device containing a printed wiring board on which electronic components are mounted, a communication apparatus comprising such information processing devices installed in a rack, and a method of connecting external cables to the information processing device.

2. Description of the Related Art

Conventional communication apparatus comprises a vertical row of information processing devices each containing a printed wiring board on which electronic components are mounted, and is installed at the site of a base station or the like. Such electronic components include heat-emitting devices, and accordingly, the information processing device is often equipped with a plurality of fans or the like constituting a ventilation arrangement for cooling the internal components (see, e.g., Unexamined Japanese Patent Publication No. H01-238097).

FIGS. 21A to 21C schematically illustrate an exemplary construction of a conventional communication apparatus, wherein FIG. 21A is a front view of the apparatus, FIG. 21B is a rear view of the apparatus, and FIG. 21C is a left side view of the apparatus.

The communication apparatus 101 comprises a vertical row of information processing devices 103 arranged on a rack 102 constituted by metal plates welded together. In the figures, only one information processing device 103 is shown for convenience' sake. The information processing device 103 contains a printed wiring board on which electronic components are mounted. Also, external cables 104 for inputting/outputting signals and power cables 105 for supplying electric power are connected to the front and rear, respectively, of the information processing device 103.

FIGS. 22A and 22B schematically illustrate an exemplary construction of the conventional information processing device, wherein FIG. 22A is a front view of the device and FIG. 22B is a rear view of the device.

The front of the information processing device 103 is provided with connectors 106 to which personal computers etc. are connected, a slot 107 in which a memory card storing predetermined settings is inserted, a display section 108 constituted by a plurality of LEDs, and connection ports 109 to which external cables 104 are connected. A plurality of vent holes 110 for admitting fresh air are formed in the other region of the front surface.

The rear of the information processing device 103 is provided with power supply terminals 111 to which power cables 105 are connected, motor-driven fans 112, and breakers 113 for cutting off the power supply.

Meanwhile, with the recent tendency toward larger capacity and higher output of communication apparatus, an increasing number of external cables are connected to individual information processing devices. To secure a connection space for numerous external cables, the areas of the front and rear surfaces of the information processing device are increased, for example.

However, the following problems arise when a large number of external cables are connected.

Specifically, in communication apparatus in which numerous external cables are connected to the front and rear of each information processing device, the front and rear surfaces of each device need to be increased to secure a connection space for the external cables. As a result, the body of each information processing device increases in size, requiring an installation space larger than the capacity that the internal electronic circuitry originally requires. Namely, increase in the number of external cables leads to useless increase of the space occupied by the information processing device.

Also, in small-sized communication apparatus with a relatively small height, printed wiring boards are horizontally positioned within each information processing device and cooling air is introduced into the device so as to flow in the depth direction. Consequently, the front and rear of the device need to be provided with a cooling arrangement such as vent holes and fans, besides the connection ports for the external cables. In this case, the number of external cables and the size of the cooling arrangement are the factors that determine the overall size of the information processing device and thus of the communication apparatus. To reduce the size of the information processing device without decreasing the number of external cables, expensive components such as small-sized, high-output motors need to be used, giving rise to a problem that the cost increases.

In medium- or large-sized communication apparatus with a relatively large height, printed wiring boards are vertically positioned within each information processing device and cooling air is introduced into the communication apparatus so as to flow in the vertical direction. Consequently, the body of the information processing device is increased in height and occupies an installation space larger than the capacity that the internal electronic circuitry originally requires. It is also necessary to provide the top and bottom of the communication apparatus with a cooling arrangement such as fans and convection inducers, which entails useless increase of the installation space for the communication apparatus.

SUMMARY OF THE INVENTION

The present invention was created in view of the above circumstances, and an object thereof is to provide a communication apparatus which occupies a small space and yet can be connected with a large number of external cables and which also permits a cooling arrangement to be incorporated therein at low cost.

To achieve the object, there is provided a communication apparatus which comprises an information processing device having a boxlike body and installed in a rack, the body having top and bottom surfaces greater in area than side surfaces thereof and containing a printed wiring board on which electronic components are mounted. In the communication apparatus, a plurality of connection ports electrically connected to the electronic components and also connected with external cables are provided on at least one of the top and bottom surfaces of the information processing device, and the external cables connected to the connection ports are guided to outside of the communication apparatus along the surface provided with the connection ports.

Also, to achieve the above object, there is provided an information processing device installed in a rack to constitute a communication apparatus and comprising a boxlike body having top and bottom surfaces greater in area than side surfaces thereof and containing a printed wiring board on which electronic components are mounted. A plurality of connection ports electrically connected to the electronic components and also connected with external cables are provided on at least one of the top and bottom surfaces of the information processing device, and when the information processing device is set in the communication apparatus, the external cables connected to the connection ports are guided to outside of the communication apparatus along the surface provided with the connection ports.

Further, to achieve the above object, there is provided a method of electrically connecting external cables to electronic components inside an information processing device installed in a rack of a communication apparatus. The external cable connection method comprises the step of connecting the external cables to respective connection ports provided on at least one of top and bottom surfaces of the information processing device, and the step, executed when the information processing device is set in the communication apparatus, of guiding the external cables connected to the connection ports to outside of the communication apparatus along the surface provided with the connection ports.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 11A through 11F schematically illustrate the manner of how external cables are connected.

FIGS. 14A and 14B illustrate how the external cables are accommodated and how the communication apparatus is cooled, wherein FIG. 14A is a front view of the communication apparatus and FIG. 14B is a left side view of the communication apparatus.

FIGS. 15A and 15B illustrate, as a first comparative example, how external cables are accommodated and how a conventional communication apparatus is cooled, wherein FIG. 15A is a front view of the communication apparatus and FIG. 15B is a left side view of the communication apparatus.

FIGS. 16A and 16B illustrate, as a second comparative example, how external cables are accommodated and how a conventional communication apparatus is cooled, wherein FIG. 16A is a front view of the communication apparatus and FIG. 16B is a left side view of the communication apparatus.

FIGS. 17A to 17C schematically illustrate an exemplary construction of a communication apparatus according to a second embodiment, wherein FIG. 17A is a front view of the apparatus, FIG. 17B is a rear view of the apparatus, and FIG. 17C is a left side view of the apparatus.

FIGS. 18A and 18B illustrate an exemplary construction of an information processing device, wherein FIG. 18A is a plan view of the information processing device and FIG. 18B is a bottom view of the same device.

FIG. 20 is a perspective view showing the construction of an information processing device according to a modification.

FIGS. 21A to 21C schematically illustrate an exemplary construction of a conventional communication apparatus, wherein FIG. 21A is a front view of the apparatus, FIG. 21B is a rear view of the apparatus, and FIG. 21C is a left side view of the apparatus.

FIGS. 22A and 22B schematically illustrate an exemplary construction of a conventional information processing device, wherein FIG. 22A is a front view of the device and FIG. 22B is a rear view of the device.

DESCRIPTION OF THE PREFERRED EMBODIMENTS

Figure 1:
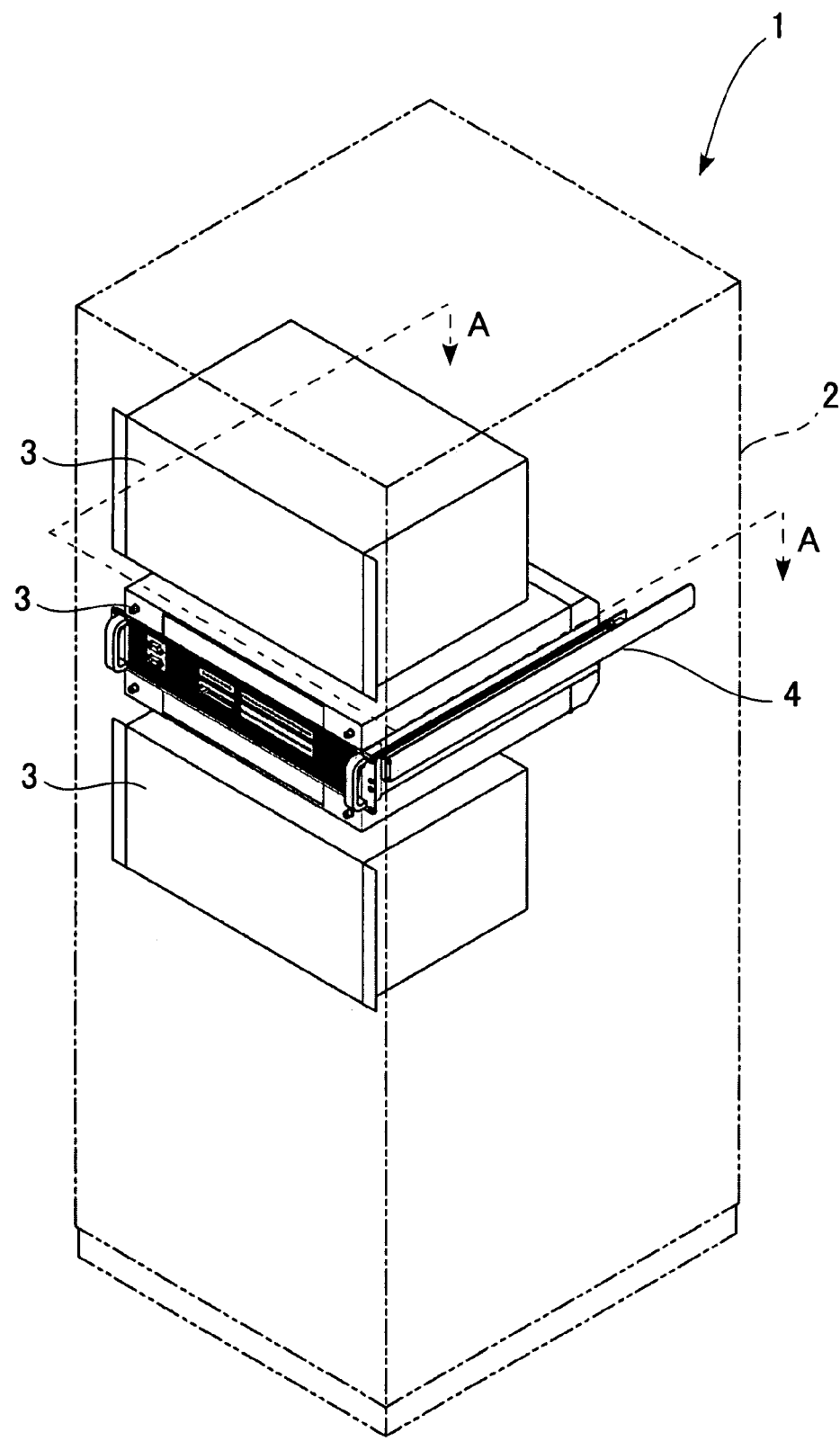
FIG. 1 is a perspective view schematically illustrating a communication apparatus according to a first embodiment.

Preferred embodiments of the present invention will be described in detail below with reference to the accompanying drawings, wherein like reference numerals refer to like elements throughout.

First Embodiment

FIG. 1 is a perspective view schematically showing the construction of a communication apparatus according to a first embodiment.

The communication apparatus 1 comprises a vertical row of information processing devices 3 arranged in a rack 2 which is a framework of metal plates welded together. Each information processing device 3 is supported by guide rails 4 attached to the rack 2 so as to extend in the depth direction and can be pulled frontward along the guide rails 4.

Figure 2:
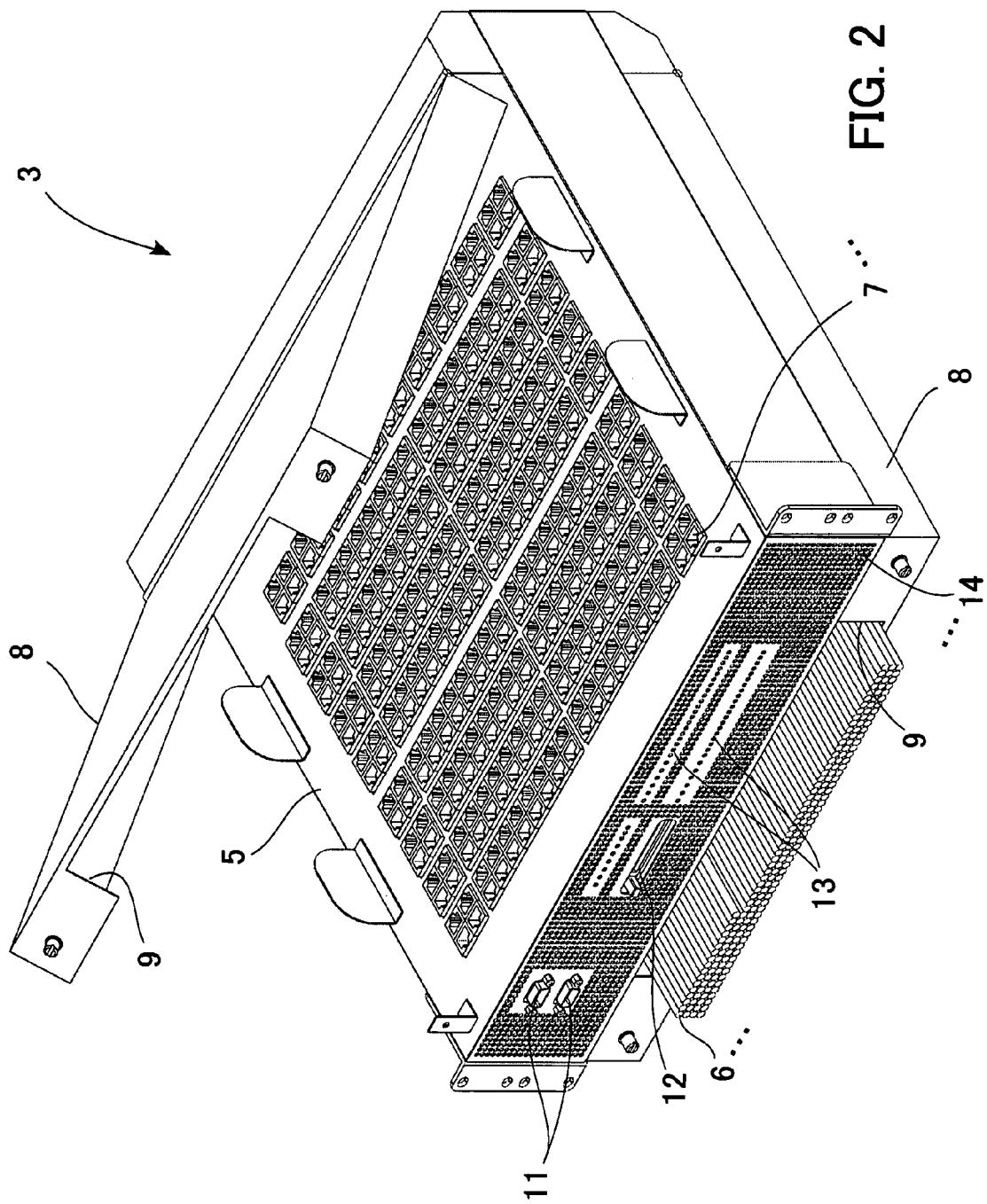
FIG. 2 is a perspective view of an information processing device.
Figure 3:
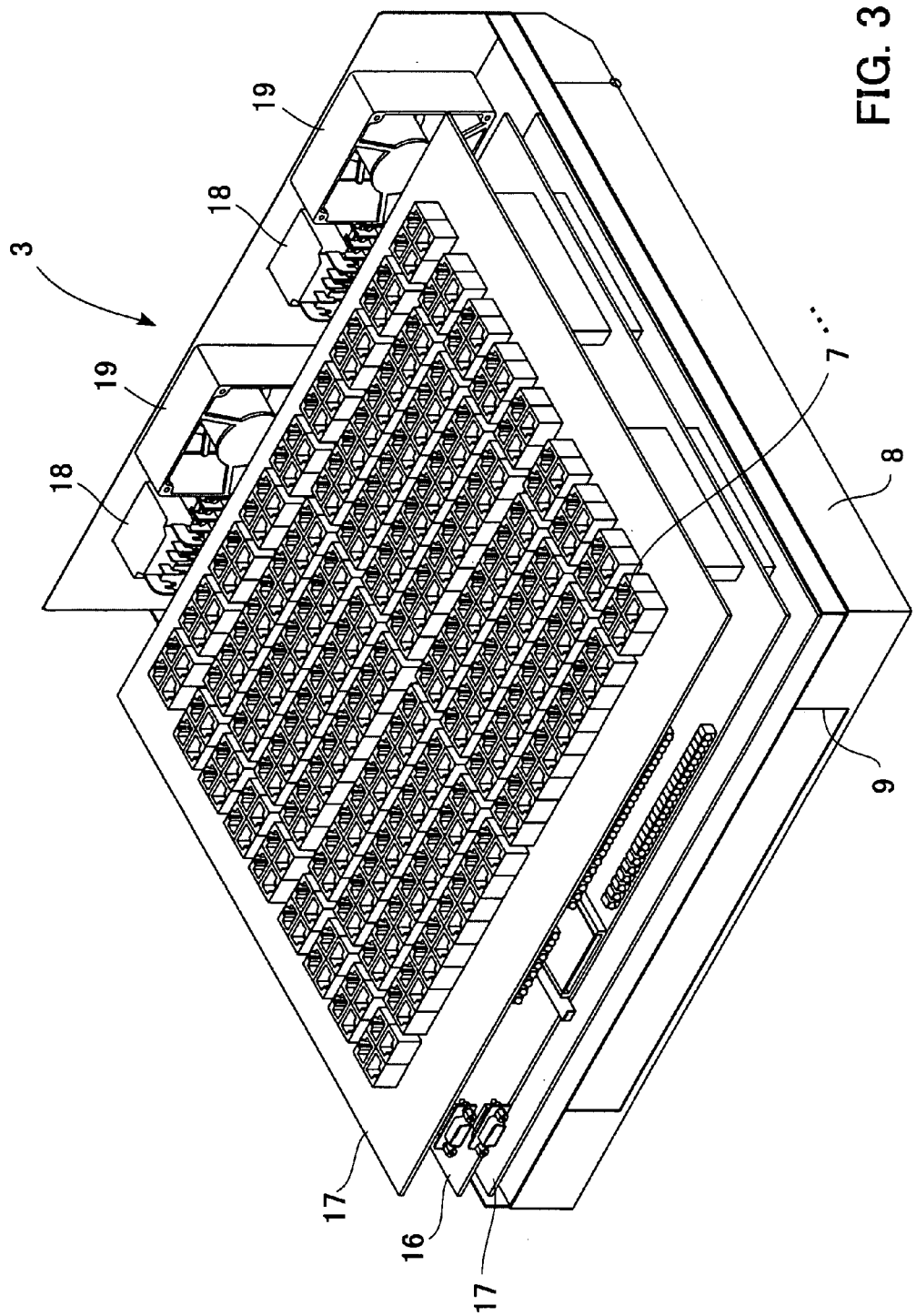
FIG. 3 is a perspective view showing the interior of the information processing device.

FIG. 2 is a perspective view of the information processing device, and FIG. 3 is a perspective view showing the interior of the information processing device.

As shown in FIG. 2, the information processing device 3 has a boxlike body 5 of which the top and bottom surfaces have a greater area than the side surfaces. The top and bottom surfaces of the body 5 are each provided with an array of numerous connection ports 7 to which connectors of external cables 6 are connected. External cable covers 8 are arranged so as to cover the top and bottom surfaces, respectively, of the body. Each external cable cover 8 is vertically swingable about a hinge provided at the rear end portion of the body 5 and has a rectangular opening 9 formed in its front end face to allow the external cables 6 to be passed therethrough to outside. The external cable covers 8 can be held at a predetermined swing angle by locks, not shown, so that the top surface of the body 5 can be kept open, or exposed to outside. Although not shown in FIG. 2, the bottom surface of the body 5 is also provided with an array of connection ports 7, like the top surface, and numerous external cables 6 are connected also to the connection ports 7 on the top surface of the body, like the bottom surface, and are passed through the opening in the front end face of the upper cover.

On the front surface of the body 5 are provided connectors 11 to which personal computers or the like are connected, a slot 12 in which a memory card storing predetermined settings is inserted, and display sections 13 constituted by LEDs. A large number of vent holes 14 for admitting fresh air are formed in the other region of the front surface of the body.

As shown in FIG. 3, the information processing device 3 contains a printed wiring board 16 on which electronic components are mounted, as well as printed wiring boards 17 on which numerous connectors constituting the connection ports 7 are mounted. The printed wiring boards 16 and 17 are each horizontally positioned in such a manner that one wiring board is located above another. The electronic components and the connection ports 7 are electrically connected by internal wiring.

The rear of the information processing device 3 is provided with power supply terminals 18 to which external power cables are connected, and a pair of fans 19 driven by motors. Thus, when the fans 19 are driven, air is admitted through the vent holes 14 in the front surface of the body and discharged to the outside from the rear of the body. While passing through the gaps between the printed wiring boards 16 and 17, the air cools the wiring boards.

Figure 4:
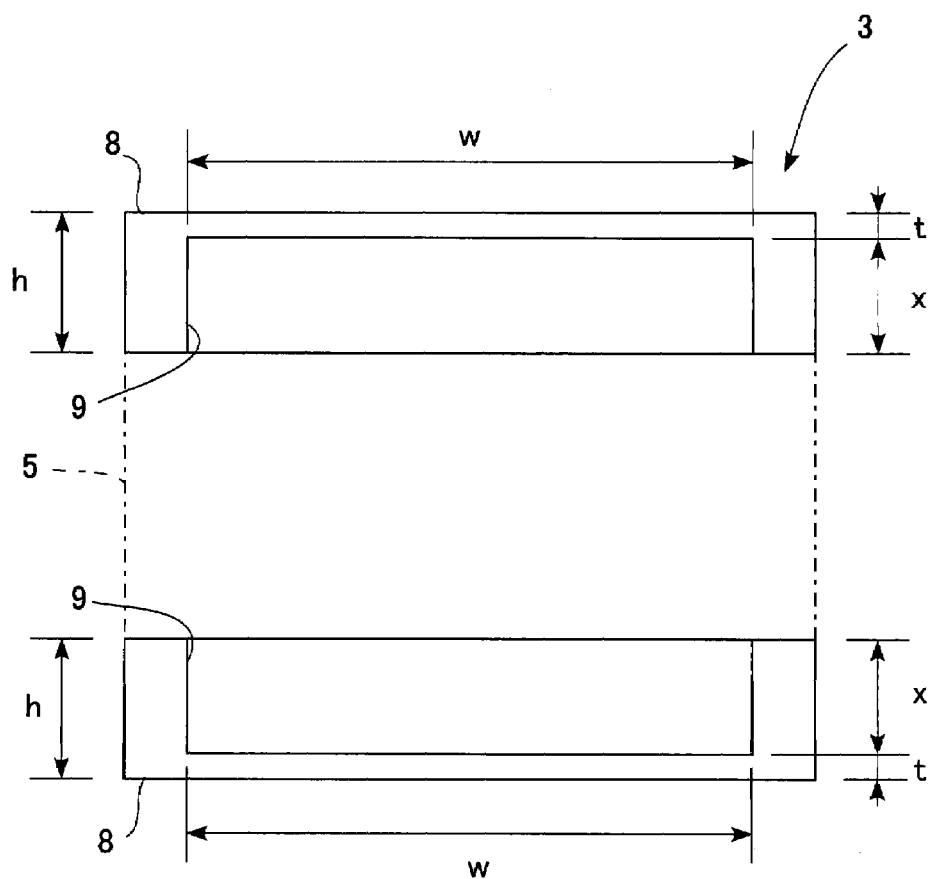
FIG. 4 schematically illustrates external cable covers.

FIG. 4 schematically illustrates the external cable covers.

The external cables 6 connected to the connection ports 7 on the top and bottom surfaces of the body 5 of the information processing device 3 are individually guided in a bundle along the top and bottom surfaces, respectively, toward the front of the body 5, as mentioned above. The height of the external cable covers 8 is set to the smallest possible value, in order to reduce the overall height of the information processing device 3.

Specifically, provided the external cable 6 with diameter D is connected perpendicularly to a horizontal plane and is guided parallel to the same plane, the bending radius of the connected part of the external cable 6 (the bending radius of the inside of the external cable 6 that hardly affects the transmission function or the service life) r is generally given by $r=D\times 5$ Accordingly, the external cable 6 bent in this manner requires a height equal to the sum of the bending radius r and the diameter D. In this embodiment, a cable passage height x is set to the minimum height of the external cable 6, namely, the sum of the bending radius r and the diameter D ($x=5D+D=6D$). Consequently, the height h of the external cable cover 8 is equal to the sum of x and the thickness t of the cover, namely, $h=6D+t$.

Alternatively, the height of the external cable cover may be set in the following manner. It is assumed, for example, that the number y of external cables 6 that can be introduced to each of the top and bottom surfaces of the body 5 in a space-saving manner is 60% of the number of external cables 6 that can be closely arrayed in the opening 9 of the external cable cover 8 without being bent. Given that the minimum set height and width of the opening 9 are x2 and w, respectively, then $x2\times w\times 0.6=y\times (r\times r)$, and therefore, the height h of the external cable cover 8 is given by $h=x2+t=y\times (r\times r)/(w\times 0.6)+t$.

The height h of the external cable cover 8 can be set to an almost minimum value by deriving the height h in the aforementioned manner, thus making it possible to reduce the height of the information processing device 3.

Figure 5:
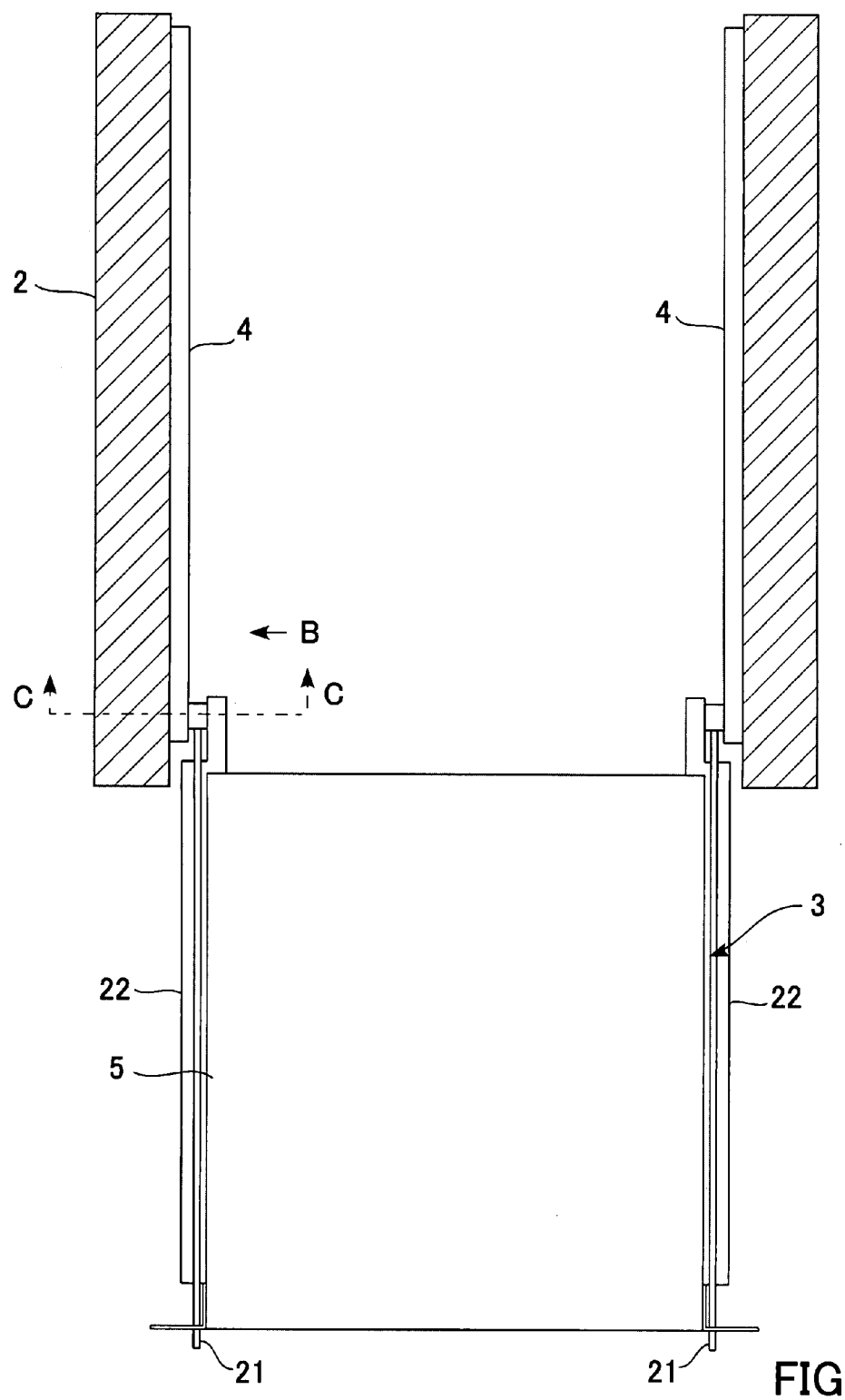
FIG. 5 is a sectional view of a rack taken along line A-A in FIG. 1 and illustrates the information processing device pulled out of the communication apparatus.

The following describes the mechanism whereby the information processing device 3 can be pulled out of the communication apparatus 1 to permit the external cables 6 to be attached and detached. FIG. 5 is a sectional view of the rack taken along line A-A in FIG. 1 and illustrates the information processing device pulled out of the communication apparatus, and FIG. 6 shows rails as viewed from direction B in FIG. 5.

As shown in FIG. 5, the information processing device 3 is slidable back and forth along the guide rails 4 extending in the depth direction of the rack 2 and can be pulled toward the front of the communication apparatus 1 by pulling handles 21 forward. Slide rails 22 slidable along the respective guide rails 4 are attached to the right and left side surfaces, respectively, of the body 5 of the information processing device 3. The guide rails 4 and the slide rails 22 constitute a slide mechanism.

Figure 6:
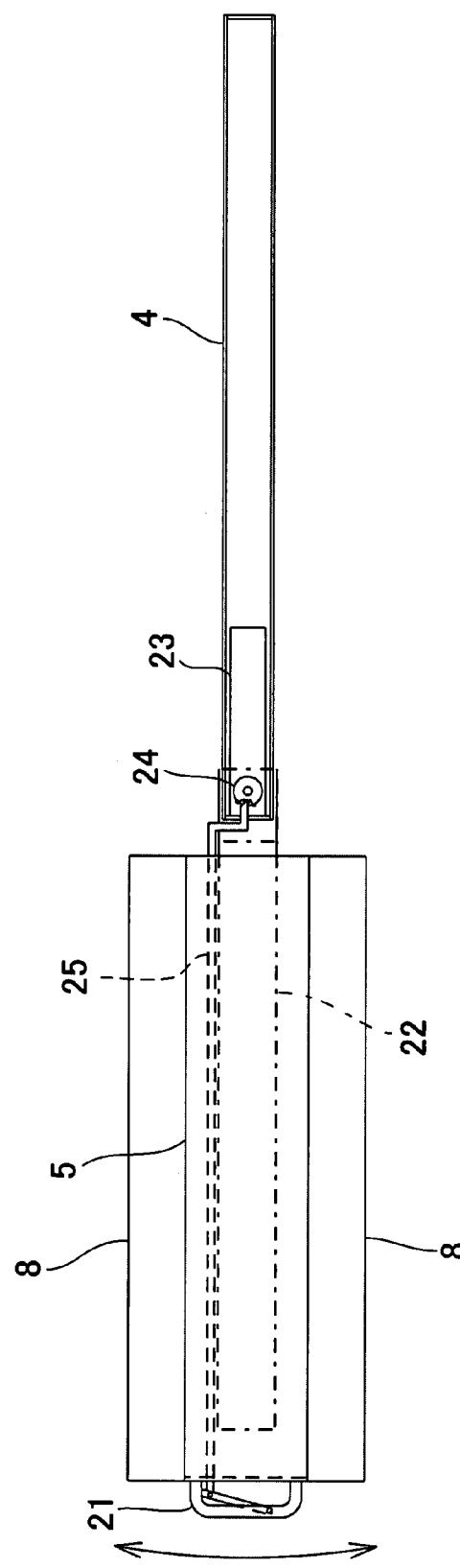
FIG. 6 shows rails as viewed from direction B in FIG. 5.

Further, as shown in FIG. 6, a small rail 23 is arranged between each guide rail 4 and the corresponding slide rail 22 to connect the rails 4 and 22 to each other. The small rail 23 is slidably received in the inside of the guide rail 4 and coupled to the distal end of the slide rail 22 through the shaft of a toothed locking member 24 attached to the front end of the small rail 23. The locking member 24 is engaged with the distal end of a movable locking pin 25 extending from the handle 21 along the slide rail 22.

Figure 7:
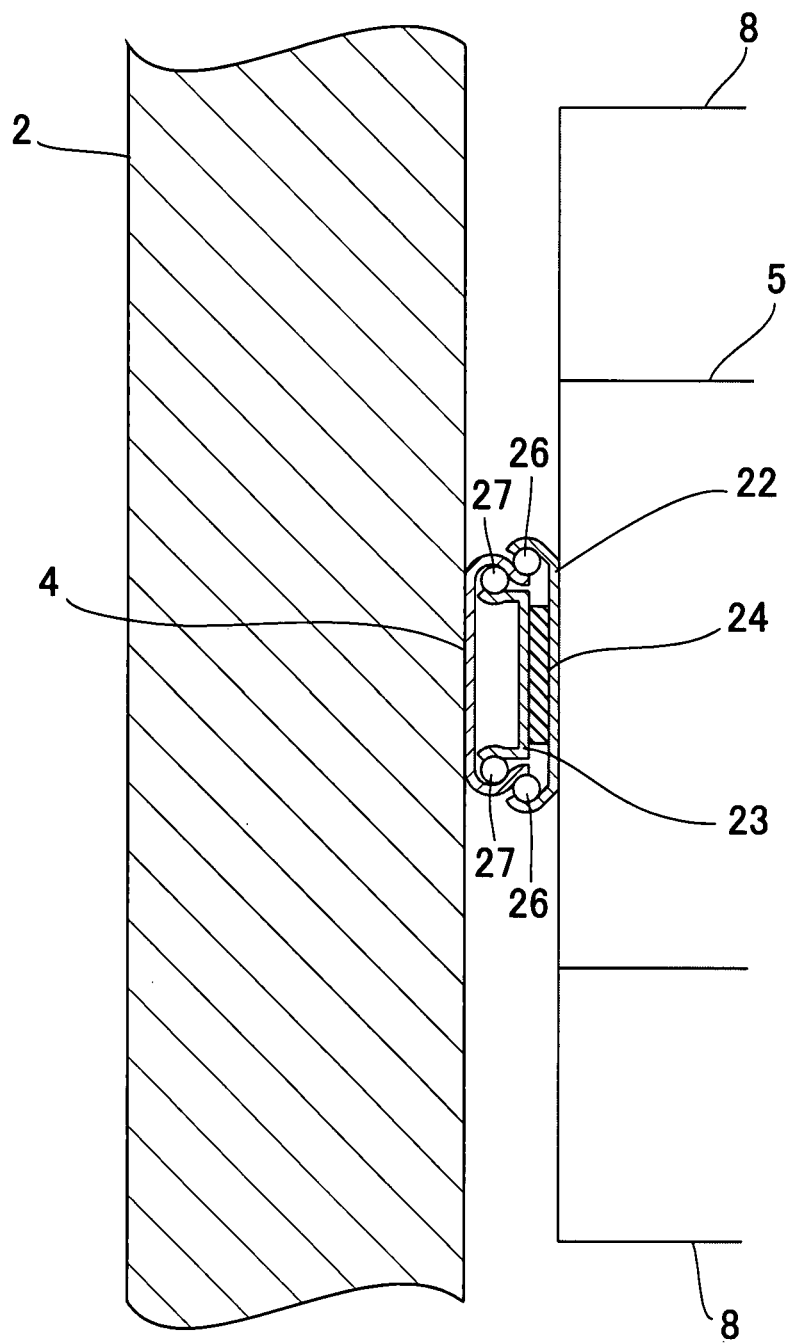
FIG. 7 is an enlarged sectional view of the rails taken along line C-C in FIG. 5.
Figure 8:
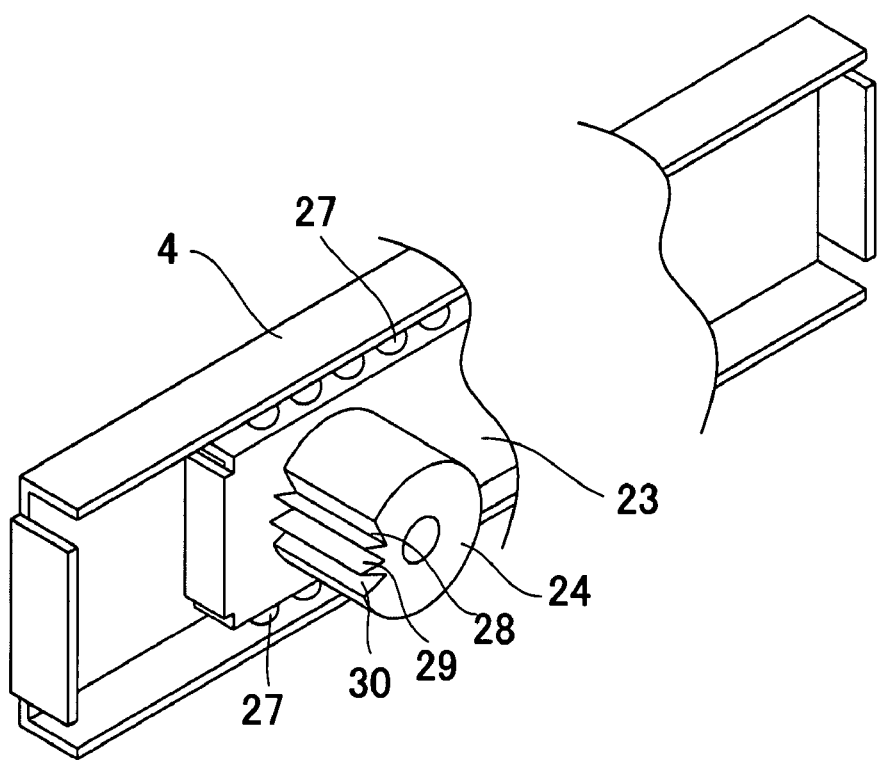
FIG. 8 is a fragmentary perspective view showing a small rail and its related parts.

FIG. 7 is an enlarged sectional view of the rails taken along line C-C in FIG. 5, and FIG. 8 is a fragmentary perspective view showing the small rail and its related parts.

As shown in FIG. 7, a ball bearing 26 is interposed between the guide rail 4 and the slide rail 22, and a ball bearing 27 is interposed between the guide rail 4 and the small rail 23, thereby making the rails highly slidable relative to each other in their longitudinal direction.

The locking member 24 attached to the small rail 23, as shown in FIG. 8, has engaging grooves 28, 29 and 30 cut in the front region of its outer peripheral surface at predetermined intervals. The distal end of the movable locking pin 25 is engaged with one of these engaging grooves so that the angle of the information processing device 3 with respect to the communication apparatus 1 can be varied. The locking member 24 of the small rail 23 and the movable locking pin 25 constitute a rocking mechanism.

Figure 9:
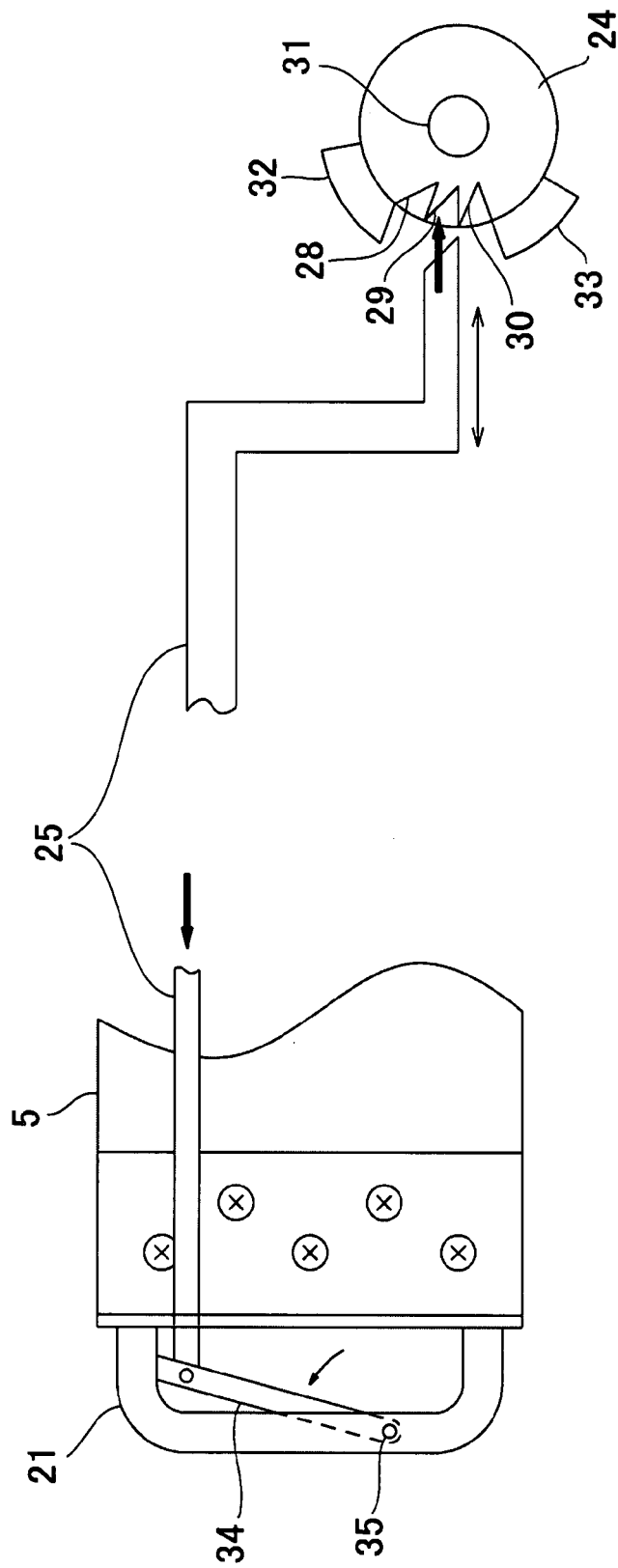
FIG. 9 is a diagram illustrating the principle of a rocking mechanism for the information processing device.
Figure 10:
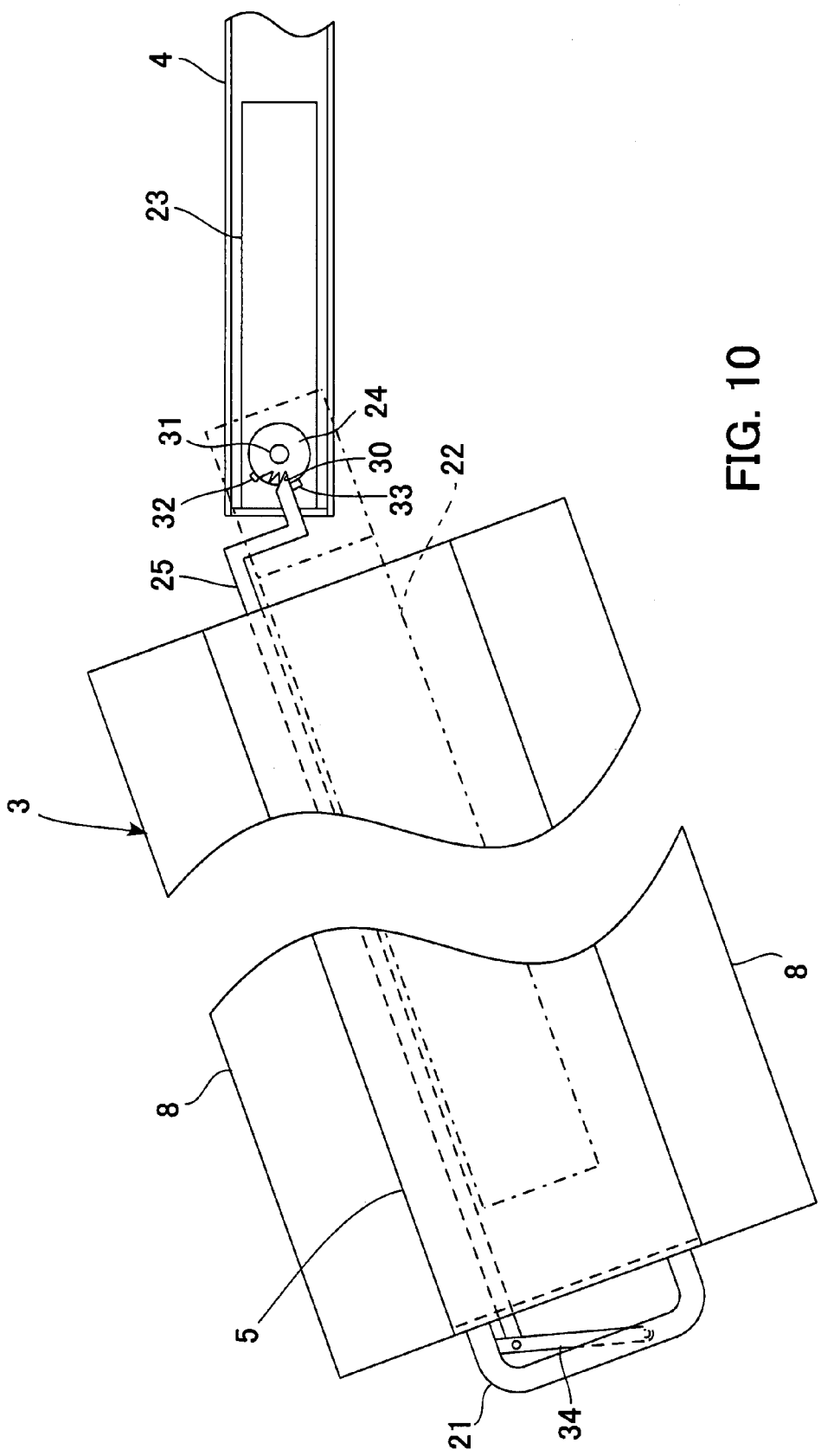
FIG. 10 illustrates rocking movement of the information processing device.

FIG. 9 illustrates the principle of the rocking mechanism of the information processing device, wherein the front and rear end portions of the information processing device 3 are shown in the left- and right-hand parts of the figure, respectively, but on different scales for convenience' sake, and FIG. 10 illustrates rocking movement of the information processing device.

As shown in FIG. 9, the engaging grooves 28, 29 and 30 of the locking member 24 each have a triangular cross-sectional form with predetermined angles so as to nearly coincide with the shape of the distal end of the movable locking pin 25. When disengaged from the engaging groove, the movable locking pin 25 can be rocked, together with the body 5 of the information processing device 3, around the shaft 31 of the locking member 24. Since rock-limiting protuberances 32 and 33 are formed on the locking member 24 so as to adjoin the respective opposite engaging grooves 28 and 30, however, the movable locking pin 25 is prevented from rocking beyond the engaging grooves 28 and 30. Namely, the rocking range of the body 5 is limited.

The handle 21 of the body 5 is provided with a lever 34 coupled to the front end (opposite to the distal end) of the movable locking pin 25. The movable locking pin 25 and the lever 34 constitute a link mechanism. The lever 34 has one end coupled to a pivot 35 fixed to a lower part of the handle 21 so that the lever can be turned about the pivot, and has the other end coupled to the movable locking pin 25. Also, the lever 34 is urged by a spring mechanism, not shown, to the right in FIG. 9, that is, in a direction of causing the movable locking pin 25 to engage with the locking member 25. Normally, therefore, the movable locking pin 25 remains engaged with the locking member 24, so that the information processing device 3 is fixed at a predetermined angle with respect to the communication apparatus 1. When the lever 34 is pulled frontward and thus the movable locking pin 25 is disengaged from the locking member 24, the information processing device 3 can be rocked relative to the communication apparatus 1 within the aforementioned rocking range.

Specifically, when drawing the information processing device 3 from the communication apparatus 1, the handles 21 of the body 5 are pulled forward, as shown in FIG. 10. At this time, the information processing device 3 slides horizontally with the slide rails 22 guided, together with the small rails 23, by the guide rails 4. When the front ends of the guide rails 4 are reached, the small rails 23 are prevented from further moving forward by stoppers, not shown. Thus, the information processing device 3 is prevented from dropping off the communication apparatus 1.

Then, the electrician pulls the levers 34 frontward while holding the handles 21, whereupon the movable locking pins 25 are disengaged from the respective locking members 24, permitting the information processing device 3 to tilt with respect to the communication apparatus 1. In the illustrated example, the information processing device 3 is tilted downward and fixed in position with the distal ends of the movable locking pins 25 engaged with the lower engaging grooves 30. The upper cable cover 8 may be opened with the information processing device thus tilted downward, and in this case it is easier for the electrician to see the connection ports 7 arranged on the top surface of the body 5, facilitating the attachment and detachment of the external cables 6. The information processing device 3 drawn to the forward position can also be tilted upward in like manner.

An external cable connection method will be now explained. FIGS. 11A through 11F schematically illustrate an example of how to connect external cables, and FIGS. 12 and 13, which are similar to FIG. 1, show respective states of the information processing device during the external cable connection work.

Figure 12:
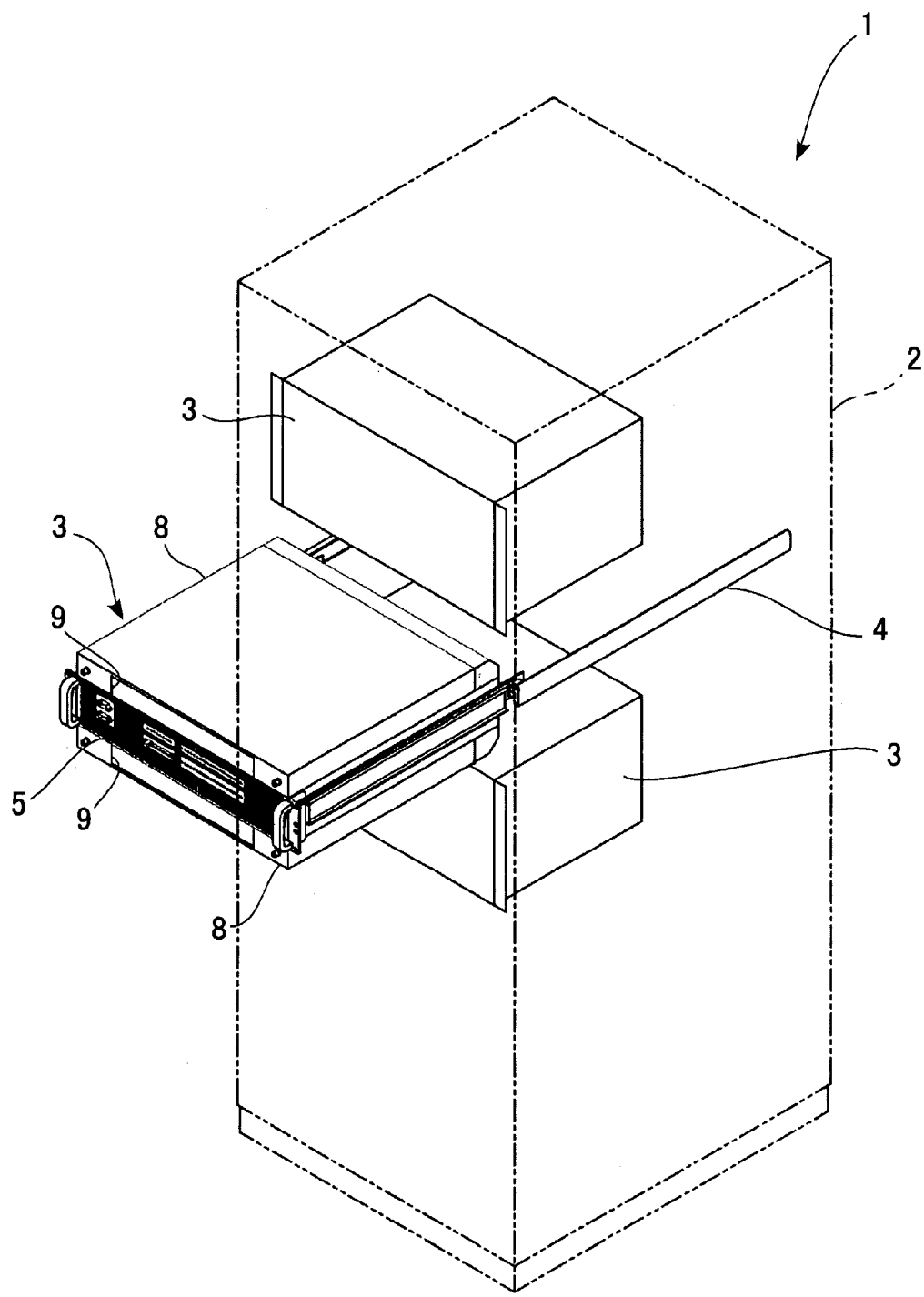
FIG. 12 shows a state of the information processing device during external cable connection work.
Figure 13:
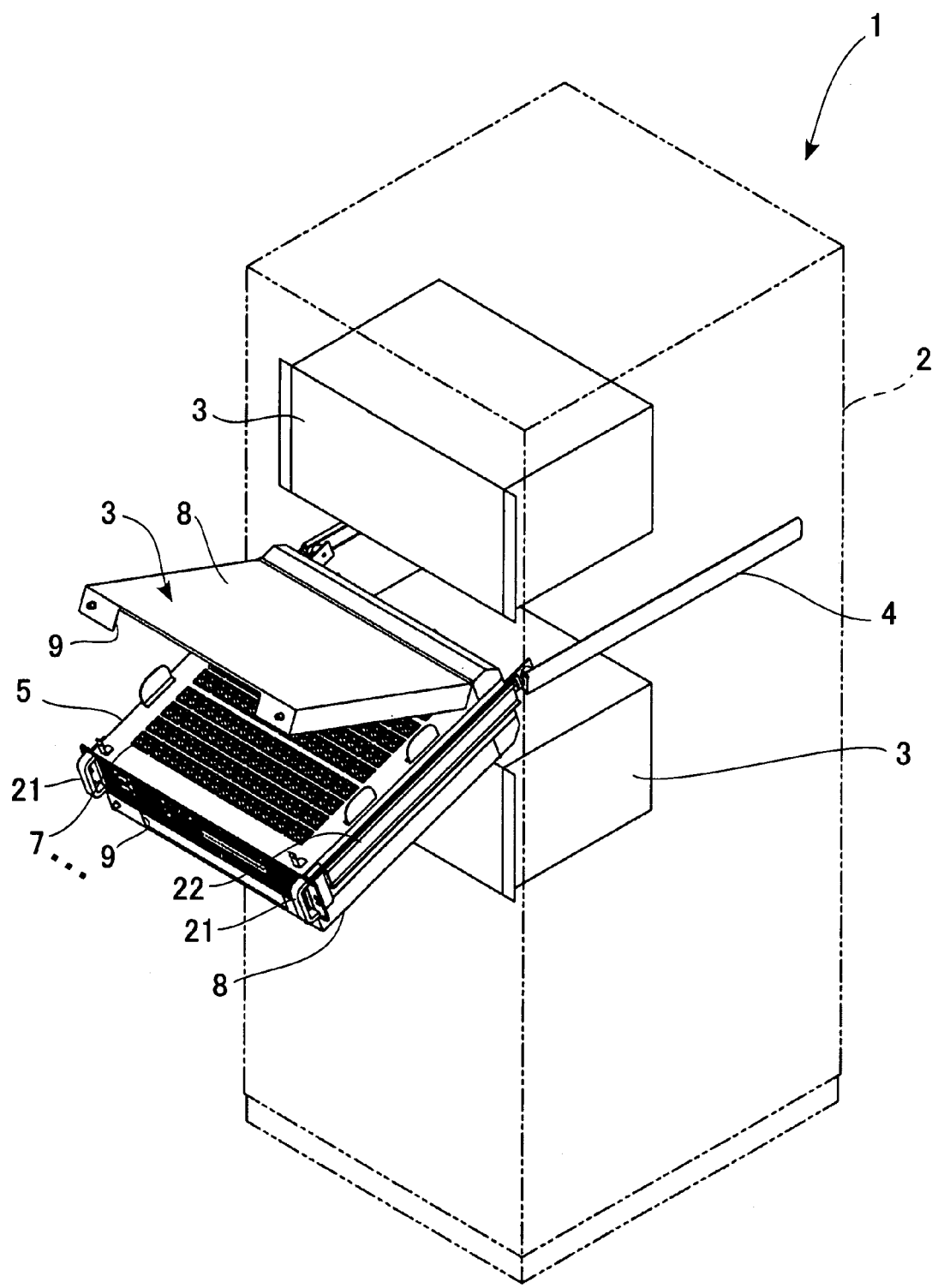
FIG. 13 shows another state of the information processing device during the external cable connection work.

At first, no external cables 6 are connected to the information processing device (FIG. 11A). A fixing member for fixing the information processing device 3 to the communication apparatus 1 is released and then the device 3 is pulled forward (in the figures, to the right) from the rack 2 (FIG. 11B). This state of the information processing device is shown in FIG. 12. After drawn to the forward limit position, the information processing device 3 is rocked down to be tilted downward, and the upper cable cover 8 is lifted from the body 5 to make the top surface of the body 5 open, or exposed to outside. This state of the information processing device is shown in FIG. 13. Subsequently, the external cables 6 are connected to the connection ports (FIG. 11C). After the connection of the external cables 6 is finished, the upper cable cover 8 is closed. At this time, the external cables 6 are brought together into a bundle to be passed through the opening 9 in the front surface of the external cable cover 8 toward the front of the communication apparatus 1.

Subsequently, the information processing device 3 is rocked up to be tilted upward, and with the lower cable cover 8 opened downward to expose the bottom surface of the body 5, external cables 6 are connected to the connection ports (FIG. 11D). After the connection of the external cables 6 is finished, the lower cable cover 8 is closed. At this time, the external cables 6 are brought together into a bundle to be passed through the opening 9 in the front surface of the external cable cover 8 toward the front of the communication apparatus 1.

Then, the information processing device 3 is returned to the horizontal position and pushed back into the rack 2 (FIGS. 11E and 11F). After the information processing device 3 is returned to a predetermined position, the device 3 is fixed to the communication apparatus 1 by the aforementioned fixing member, thus completing the installation.

Figure 14A:
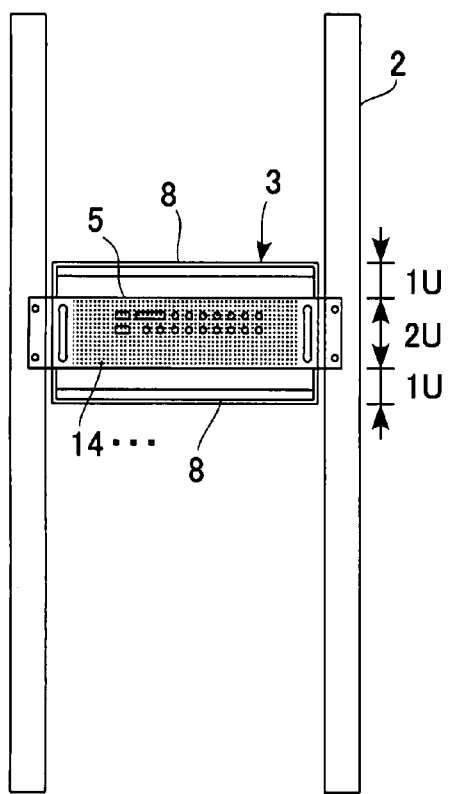
Figure 14B:
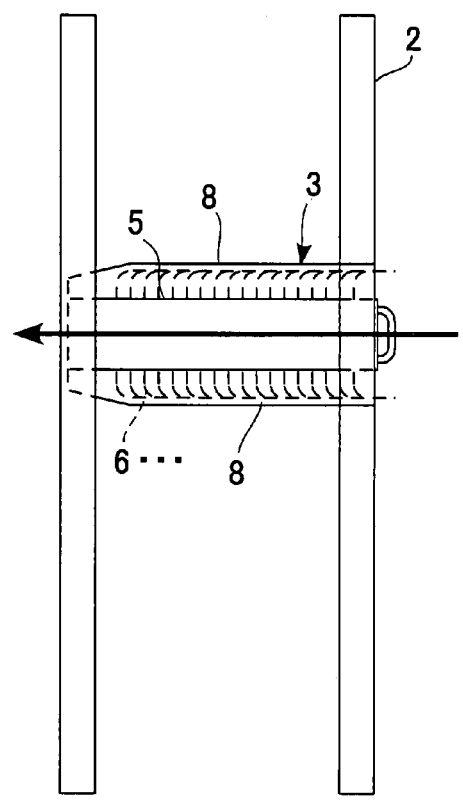
Figures 15A, 15B:
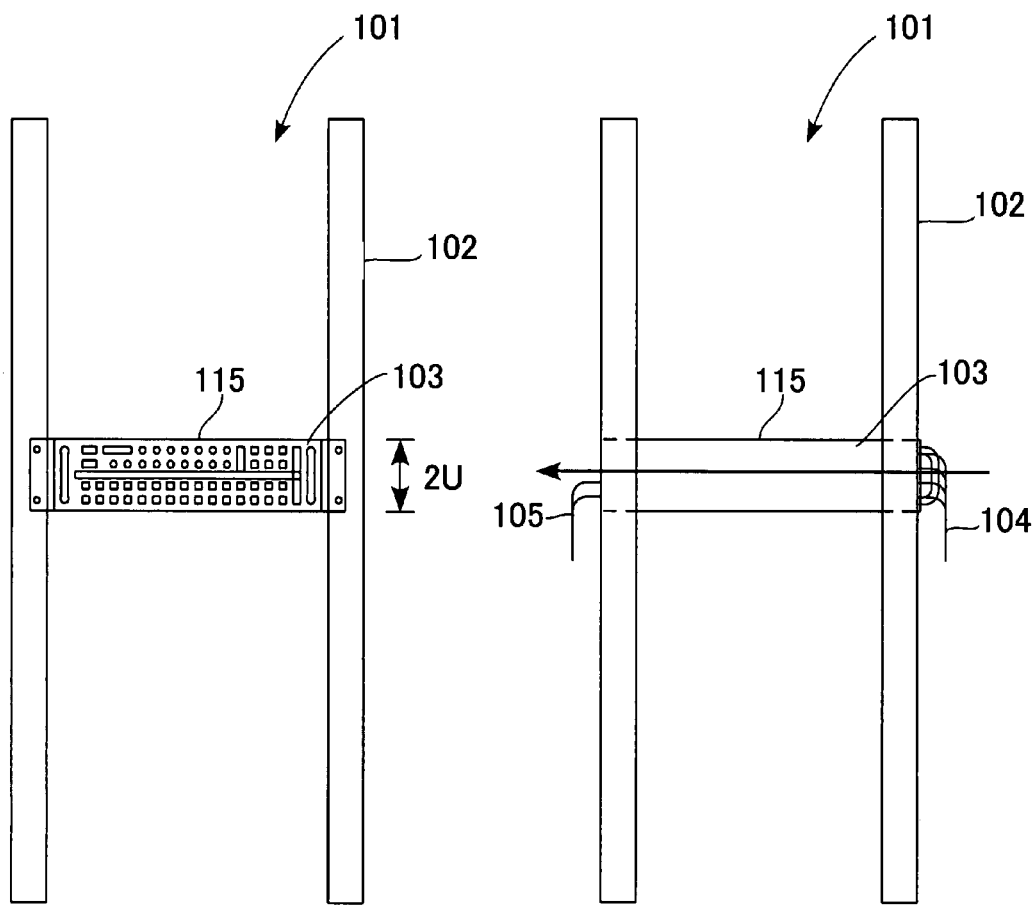
Figures 16A, 16B:
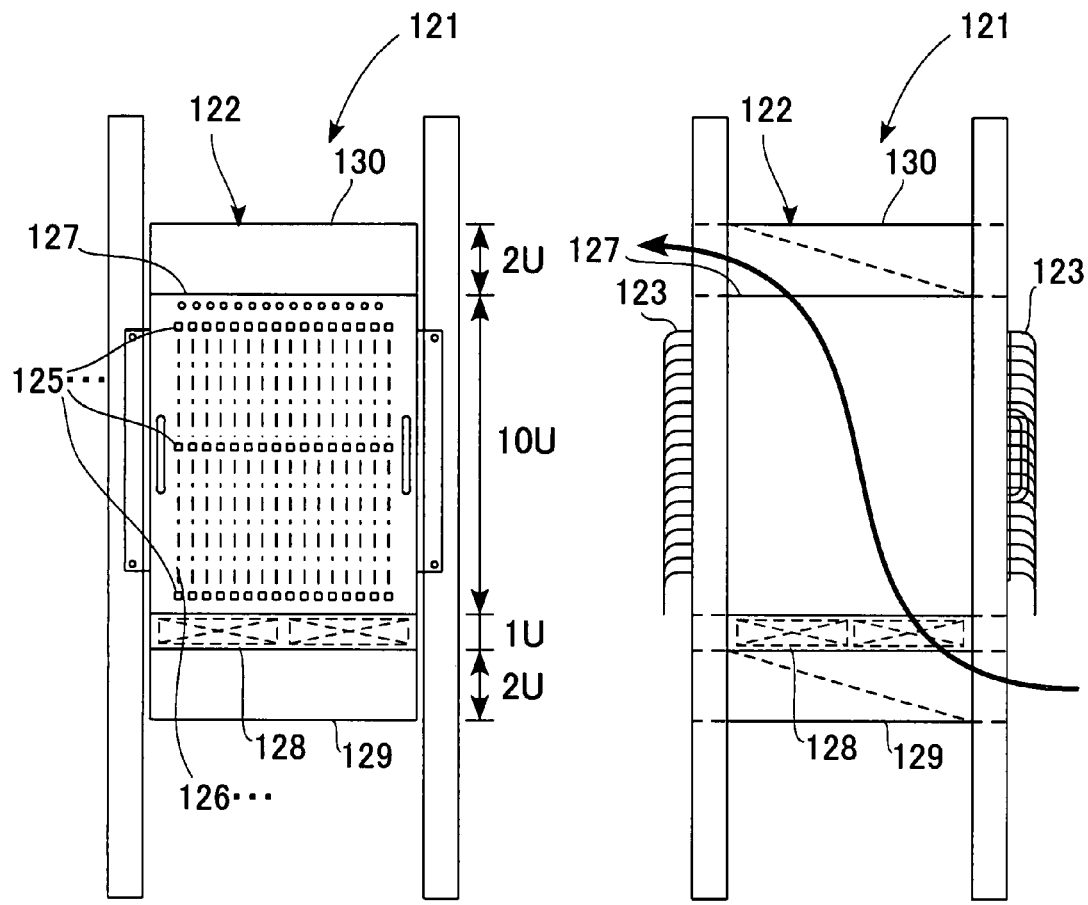

The advantages achieved by this embodiment will be now explained in comparison with conventional apparatus. FIGS. 14A and 14B illustrate how the external cables are accommodated and how the communication apparatus is cooled according to the embodiment, wherein FIG. 14A is a front view of the communication apparatus and FIG. 14B is a left side view of the communication apparatus. FIGS. 15A and 15B illustrate, as a first comparative example, how external cables are accommodated and how a conventional communication apparatus is cooled, wherein FIG. 15A is a front view of the communication apparatus and FIG. 15B is a left side view of the communication apparatus. FIGS. 16A and 16B illustrate, as a second comparative example, how external cables are accommodated and how a conventional communication apparatus is cooled, wherein FIG. 16A is a front view of the communication apparatus and FIG. 16B is a left side view of the communication apparatus.

As shown in FIG. 14A, the body 5 has a height of 2 U ("U" is a unit prescribed by EIA standards: 1 U=1.75 inches=44.45 mm) and each external cable cover 8 has a height of 1 U. Accordingly, the overall height of the information processing device 3 is 4 U. Also, the width and depth of the body 5 are set to be about 400 mm each. According to the embodiment, 356 external cables 6 could be accommodated in each of the upper and lower cable covers 8, that is, a total of 712 external cables 6 could be connected to the information processing device with the height 4 U.

Moreover, since the external cables 6 are guided along the top and bottom surfaces of the body 5 of the information processing device 3, as shown in FIG. 14B, the front and rear surfaces of the body 5 are not crowded, making it possible to spare a sufficient space for the cooling arrangement such as vent holes and fans. Namely, sufficiently high cooling efficiency can be ensured without using small-sized, high-output motors. Also, the cooling arrangement may be simplified such that fresh air admitted from the front surface of the device flows through the device to the rear of same (as indicated by the arrow in FIG. 14B), thus making it possible to construct a desired cooling arrangement at low cost.

In an information processing device 103 shown in FIGS. 15A and 15B as the first comparative example, a body 115 has a height of 2 U and a width and depth of about 400 mm each, like the embodiment, but only 46 external cables 104 or thereabout can be connected to the front surface of the body 115. The height of the body 115 was increased to enlarge the connection area for the external cables 104 and the external cables were connected to both the front and rear surfaces of the body 115, but as few as another 80 external cables 104 or thereabout could be connected to the body 115 per height increment of 1 U. Accordingly, even if the height of the first comparative example is increased to 4 U equal to the height of the embodiment shown in FIGS. 14A and 14B, only 206 (=46+80+80) external cables 104 can be connected to the body 115. In other words, the number of external cables that can be connected to the embodiment is about 3.4 times as large as that of the first comparative example.

In the case of the first comparative example, a simple cooling arrangement may be employed such that fresh air is caused to flow from the front toward the rear of the body 115, but since the area provided with the vent holes is smaller by an amount corresponding to the numerous external cables 104 connected to the front surface of the body 115, sufficiently high cooling efficiency cannot be obtained. It is therefore necessary to use small-sized, high-output motors, which leads to increase in cost.

In the conventional communication apparatus 121 shown in FIGS. 16A and 16B as the second comparative example, an information processing device 122 is configured to accommodate 712 external cables 123, like the embodiment.

To permit as many as 712 external cables 123 to be connected to the front and rear surfaces of the information processing device 122, printed wiring boards 126 are vertically positioned to secure areas for as many connection ports 125, and cooling air is caused to flow vertically through the communication apparatus.

In the illustrated communication apparatus 121, a fan unit 128 and a convection inducer 129 are arranged at the bottom of the body 127 of the information processing device 122, and another convection inducer 130 is arranged at the top of the body 127. When the fans in the fan unit 128 are driven, fresh air is introduced from the front surface of the convection inducer 129 and cools the printed wiring boards 126 in the body 127 while passing through the gaps between the wiring boards. The air heated due to the heat exchange is discharged to outside from an opening in the rear surface of the convection inducer 130.

With the configuration described above, satisfactory cooling efficiency can be achieved, but the height of the information processing device 122 needs to be increased to about 10 U (=(712−46)/80 U+2 U). Namely, the information processing device 122 requires a height 2.5 times that (4 U) of the embodiment, which entails increase in size of the communication apparatus 121.

As described above, in the communication apparatus 1 of the embodiment, the connection ports 7 for the external cables 6 are provided not on the side surfaces of the information processing device 3 but on both the top and bottom surfaces greater in area than the side surfaces. It is therefore possible to accommodate a larger number of external cables 6 than in the case where the connection ports are arranged on the side surfaces of the information processing device.

Also, the external cables 6 connected to the connection ports 7 are guided along the top and bottom surfaces of the information processing device 3 toward the front of the communication apparatus 1 with their heights restricted by the external cable covers 8. Accordingly, the information processing device need not be substantially enlarged in vertical size and the space occupied by the communication apparatus 1 as a whole can be kept small.

Further, since the external cables 6 are connected to the top and bottom surfaces of the information processing device 3, the front and rear surfaces of the device 3 have spare space, making it possible to configure a ventilation arrangement such as vent holes and fans. As a result, the cooling arrangement can be simplified and thus constructed at low cost.

Second Embodiment

Figure 17C:
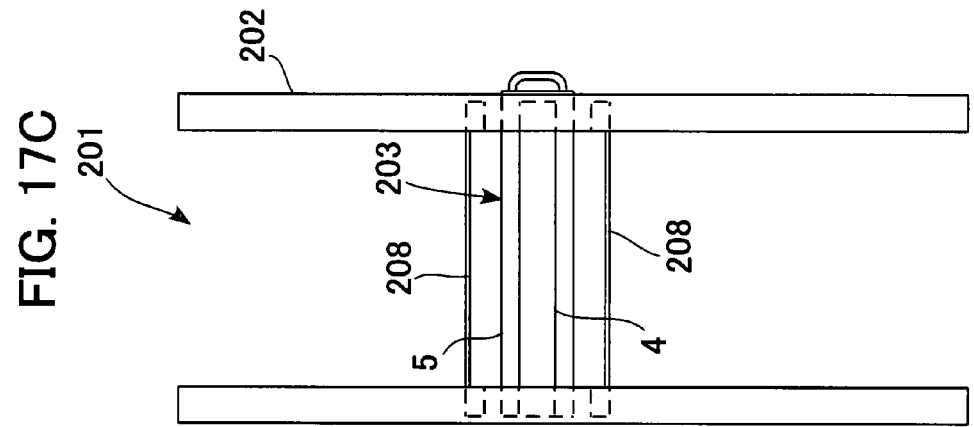
Figure 17B:
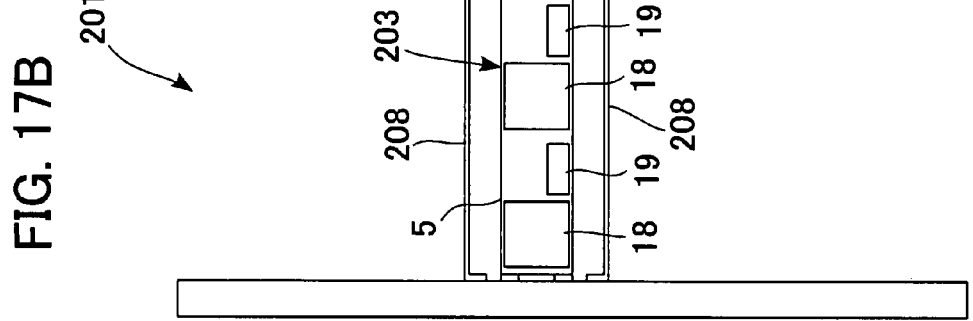
Figure 17A:
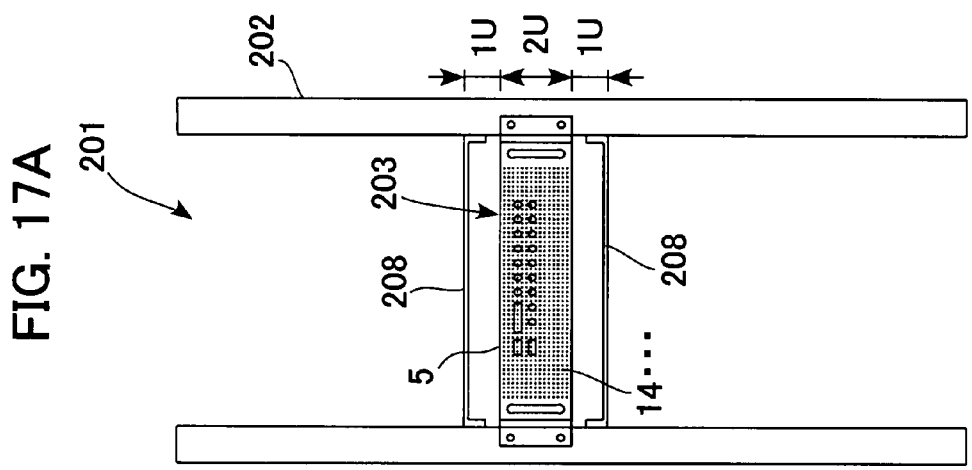

A second embodiment of the present invention will be now described. A communication apparatus according to the second embodiment is identical in construction with that of the first embodiment, except that the information processing device has no external cable covers. In the following description, therefore, like reference numerals are used to denote like elements and description of such elements is omitted. FIGS. 17A to 17C schematically show an exemplary construction of the communication apparatus of the second embodiment, wherein FIG. 17A is a front view of the apparatus, FIG. 17B is a rear view of the apparatus, and FIG. 17C is a left side view of the apparatus. FIGS. 18A and 18B illustrate an exemplary construction of the information processing device, wherein FIG. 18A is a plan view of the information processing device and FIG. 18B is a bottom view of the same device.

As seen from FIGS. 17A to 17C, the communication apparatus 201 comprises a vertical row of information processing devices 203 arranged in a rack 202 which is a framework constituted by metal plates welded together (in the figures, only one device is shown for convenience' sake). Each information processing device 203 is supported by guide rails 4 attached to the rack 202 so as to extend in the depth direction and can be pulled frontward along the guide rails 4. A large number of vent holes 14 are formed in the front surface of the information processing device 203, and power supply terminals 18 and fans 19 are arranged at the rear of the device 203.

Also, as shown in FIGS. 18A and 18B, no external cable cover is attached to the top or bottom surface of the information processing device 203, unlike the first embodiment, and an array of numerous connection ports 7 are provided on each of the top and bottom surfaces to be connected with external cables 6.

The rack 202 has partition plates 208, as shown in FIGS. 17A to 17C, which partition the inside of the rack 202 and face the top and bottom surfaces, respectively, of the information processing device 203. The partition plates 208 are so arranged that when the information processing device 203 is installed in the rack 202, the external cables 6 may be located between the upper partition plate and the top surface of the device 203 and between the lower partition plate and the bottom surface of the device 203. The levels of the partition plates 208 are set in the same manner as the height h of the external cable covers 8 shown in FIG. 4. Specifically, each partition plate is set apart from the top or bottom surface of the body 5 of the information processing device 203 at the vertical distance of x, whereby the installation space per device 203 can be reduced.

The manner of how the external cables are connected will be now described. FIGS. 19A through 19D schematically illustrate an exemplary method of connecting the external cables.

Figure 19A:
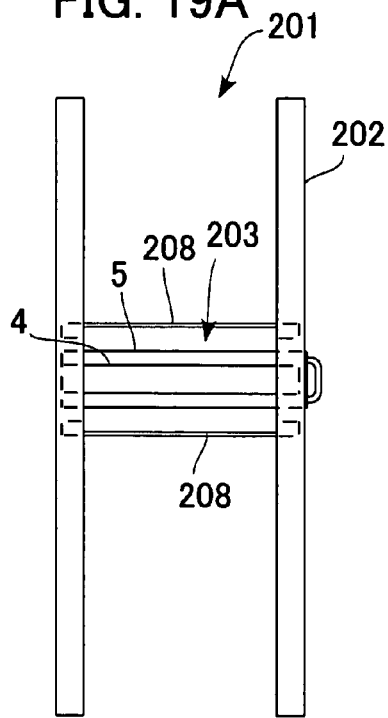
FIGS. 19A through 19D schematically illustrate the manner of how external cables are connected.
Figure 19B:
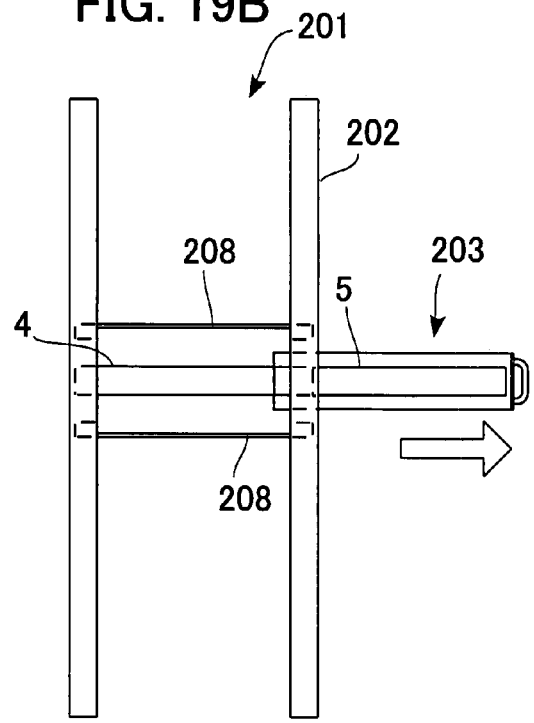
Figure 19C:
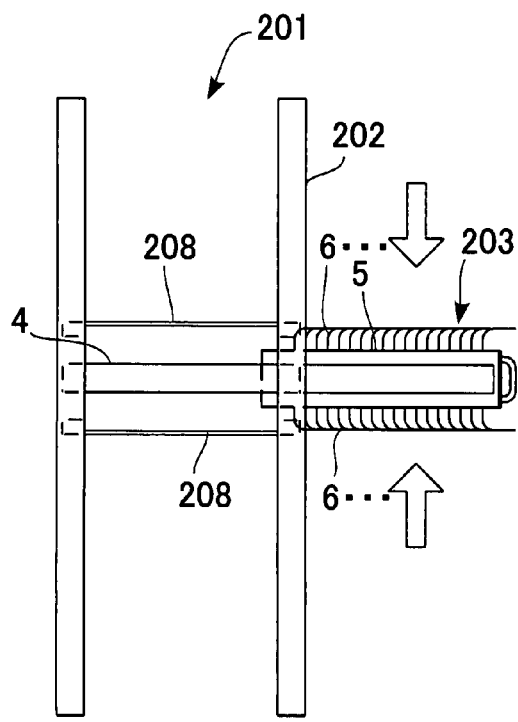
Figure 19D:
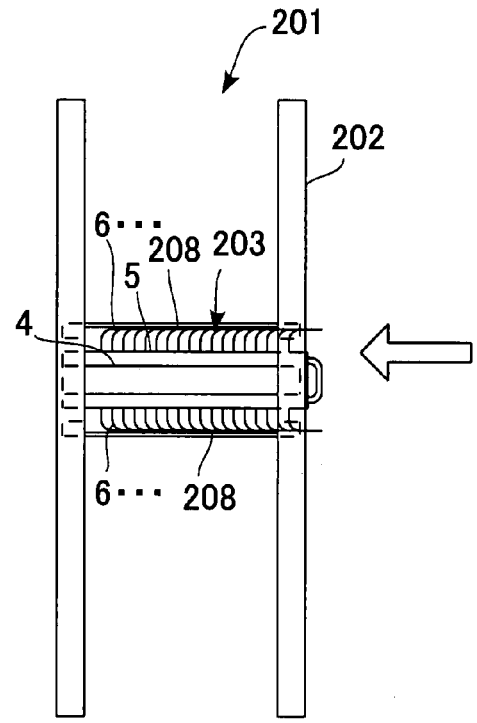
Figure 22A:
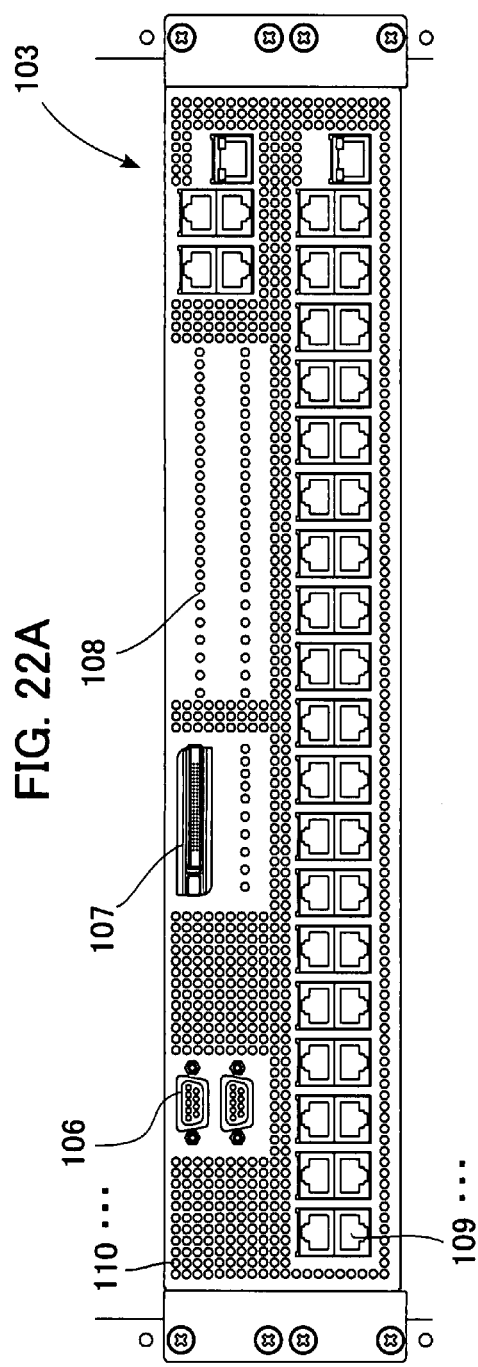
Figure 22B:
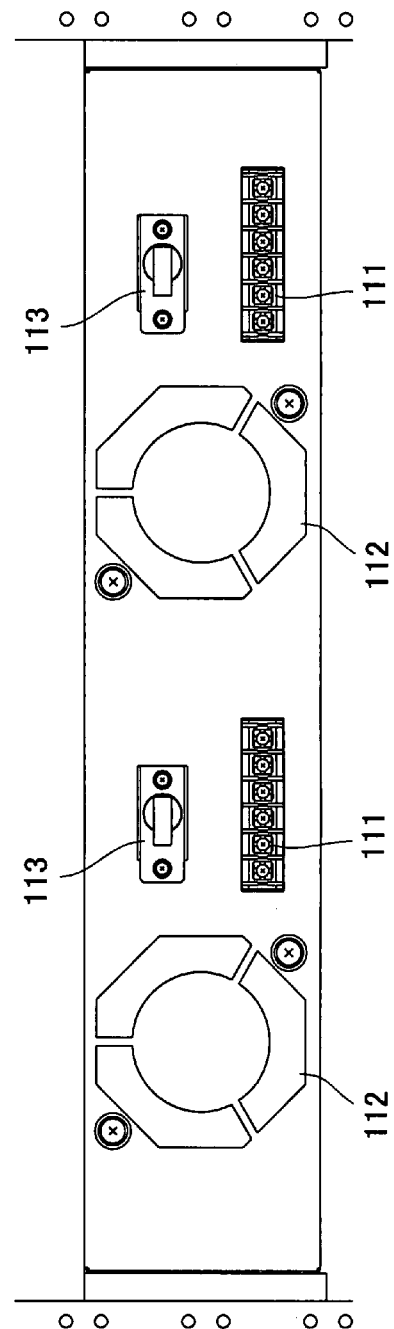

At first, no external cables 6 are connected to the information processing device (FIG. 19A). A fixing member for fixing the body 5 of the information processing device 203 to the communication apparatus 201 is released and then the device 203 is pulled forward (in the figures, to the right) from the rack 202 (FIG. 19B). After the information processing device 203 is drawn to the forward limit position, external cables 6 are connected to the exposed connection ports 7 provided on the top and bottom surfaces of the body 5 (FIG. 19C). On completion of the connection of the external cables 6, the information processing device 203 is pushed back into the rack 202 (FIG. 19D). When the device 203 is pushed back, the external cables 6 are bent toward the front and put together into bundles so as to extend along the top and bottom surfaces of the body 5. After the information processing device 203 is returned to its predetermined position, the device 203 is fixed to the communication apparatus by the aforementioned fixing member, thus completing the installation.

As described above, also in the communication apparatus 201 of the second embodiment, the connection ports 7 for the external cables 6 are provided on both the top and bottom surfaces of the information processing device 203. Also, the external cables 6 connected to the connection ports 7 are guided along the top and bottom surfaces of the information processing device 203 to the front of the communication apparatus with their heights restricted by the partition plates 208. Accordingly, the information processing device need not be substantially enlarged in vertical size and the space occupied by the communication apparatus as a whole can be kept small.

Further, since the external cables 6 are connected to the top and bottom surfaces of the information processing device 203, the front and rear surfaces of the device 203 have spare space, making it possible to configure a ventilation arrangement such as vent holes and fans. As a result, the cooling arrangement can be simplified and thus constructed at low cost.

In the first embodiment, the external cable covers 8 are each vertically swingable about the hinge arranged at the rear end portion of the body 5, as shown in FIG. 2, but may be configured in a different manner. FIG. 20 is a perspective view showing the construction of an information processing device according to a modification. In the figure, identical reference numerals are used to denote elements identical with those of the first embodiment, and description of such elements is omitted.

The information processing device 303 has external cable covers 308 detachably fitted to a body 305 thereof. Specifically, engaging frames 309 for engaging with the respective external cable covers 308 are formed at the rear end portion of the body 305, and each external cable cover 308 has an engaging edge 310 projecting from its rear end for engagement with the corresponding engaging frame. To attach the external cable cover 308, for example, to the body 305, the engaging edge 310 of the external cable cover 308 is inserted from the front into the engaging frame 309 for engagement therewith, as shown in the figure. Then, after the external cable cover 308 is placed on the top surface of the body 305, setscrews 311 provided at the front surface of the external cable cover 308 are fastened to respective tapped lugs 312 projecting from the front region of the top surface of the body 305.

In the foregoing embodiments, the connection ports for the external cables are provided on both the top and bottom surfaces of the body of the information processing device, but may be provided only on the top or bottom surface of the body. Also, part of the external cables may be connected to the side surfaces or front and rear surfaces of the body unless such cables interfere with the cooling arrangement or the like of the information processing device.

Further, in the above embodiments, the external cables are guided toward the front of the communication apparatus but may be guided toward the rear or one side of the communication apparatus.

In the foregoing embodiments, moreover, the vent holes for admitting fresh air are formed in the front surface of the information processing device and the fans are arranged at the rear of the same device. Alternatively, the vent holes for introducing fresh air may be formed in one of the rear and side surfaces of the information processing device and the fans may be arranged at the surface opposite to the surface provided with the vent holes.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A communication apparatus comprising:
   an information processing device having a boxlike body and installed in a rack, the body having top and bottom surfaces greater in area than side surfaces thereof and containing a printed wiring board on which electronic components are mounted,
   wherein a plurality of connection ports electrically connected to the electronic components and also connected with external cables are provided on at least one of the top and bottom surfaces of the body, and the external cables connected to the connection ports are guided to outside of the communication apparatus along the surface provided with the connection ports.

2. The communication apparatus according to claim 1, comprising a plurality of the information processing devices arranged in a vertical row inside the rack,
   wherein the external cables are guided through a space between vertically adjacent ones of the information processing devices so as to extend in one direction along the surface provided with the connection ports.

3. The communication apparatus according to claim 1, wherein the information processing device is capable of being pulled out of the rack in one direction, and
   the external cables are guided in the pull-out direction in which the information processing device is pulled out.

4. The communication apparatus according to claim 3, wherein the information processing device includes an external cable cover covering the surface provided with the connection ports and allowing the external cables to be located between the surface and the external cable cover, the external cable cover having an opening formed in a surface thereof to permit the external cables to be passed therethrough.

5. The communication apparatus according to claim 4, wherein the external cable cover is swingable relative to the body of the information processing device such that when the external cable cover is swung open, portions of the external cables housed in the information processing device are exposed to outside.

6. The communication apparatus according to claim 4, wherein the external cable cover has a height set based on a sum of a thickness of the external cable cover and a minimum height calculated from at least one of a bending radius of the external cables and a number of connectable external cables.

7. The communication apparatus according to claim 5, further comprising:
   a slide mechanism for allowing the information processing device to slide back and forth in the pull-out direction along guide rails attached to the rack; and
   a rocking mechanism for allowing the information processing device to rock in at least one of upward and downward directions when the information processing device is pulled out to a predetermined position.

8. The communication apparatus according to claim 7, wherein the rocking mechanism includes:
   a movable locking pin provided at the information processing device and capable of being moved back and forth from outside; and
   a locking member engaging with the movable locking pin and capable of fixing the movable locking pin at a predetermined angle with respect thereto when the locking member is located at a front distal end of the guide rail.

9. The communication apparatus according to claim 1, wherein the information processing device has vent holes formed in one of front, rear and side surfaces thereof to admit fresh air, and has a fan arranged at the surface thereof opposite to the surface provided with the vent holes.

10. The communication apparatus according to claim 3, further comprising a partition partitioning an inside of the rack and arranged so as to face that surface of the information processing device which is provided with the connection ports,
   wherein, when the information processing device is installed in the rack, the external cables are located between the surface of the body provided with the connection ports and the partition.

11. An information processing device installed in a rack to constitute a communication apparatus, comprising:
   a boxlike body having top and bottom surfaces greater in area than side surfaces thereof and containing a printed wiring board on which electronic components are mounted,
   wherein a plurality of connection ports electrically connected to the electronic components and also connected with external cables are provided on at least one of the top and bottom surfaces of the body, and when the information processing device is set in the communication apparatus, the external cables connected to the connection ports are guided to outside of the communication apparatus along the surface provided with the connection ports.

12. The information processing device according to claim 11, wherein the external cables are guided so as to extend in one direction along the surface provided with the connection ports.

13. The information processing device according to claim 12, further comprising an external cable cover covering the surface provided with the connection ports and allowing the external cables to be located between the surface and the external cable cover, the external cable cover having an opening formed in a surface thereof to permit the external cables to be passed therethrough.

14. The information processing device according to claim 13, wherein the external cable cover is swingable relative to the body of the information processing device such that when the external cable cover is swung open, portions of the external cables housed in the information processing device are exposed to outside.

15. The information processing device according to claim 13, wherein the external cable cover has a height set based on a sum of a thickness of the external cable cover and a minimum height calculated from at least one of a bending radius of the external cables and a number of connectable external cables.

16. The information processing device according to claim 11, further comprising vent holes formed in one of front, rear and side surfaces of the body to admit fresh air, and a fan arranged at the surface of the body opposite to the surface provided with the vent holes.

17. A method of electrically connecting external cables to electronic components inside an information processing device installed in a rack of a communication apparatus, comprising:
   the step of connecting the external cables to respective connection ports provided on at least one of top and bottom surfaces of a body of the information processing device; and
   the step, executed when the information processing device is set in the communication apparatus, of guiding the external cables connected to the connection ports to outside of the communication apparatus along the surface provided with the connection ports.

* * * * *